United States Patent
Müller et al.

(10) Patent No.: US 10,859,607 B2
(45) Date of Patent: Dec. 8, 2020

(54) FIBER-OPTIC SENSOR AND METHOD

(71) Applicant: ABB Power Grids Switzerland AG, Baden (CH)

(72) Inventors: Georg Müller, Glattpark (CH); Klaus Bohnert, Oberrohrdorf (CH); Andreas Frank, Zürich (CH); Philippe Gabus, Nyon (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/275,939

(22) Filed: Feb. 14, 2019

(65) Prior Publication Data

US 2019/0195921 A1    Jun. 27, 2019

Related U.S. Application Data

(63) Continuation of application No. 15/187,522, filed on Jun. 20, 2016, now Pat. No. 10,247,761, which is a (Continued)

(30) Foreign Application Priority Data

Dec. 20, 2013   (WO) ............... PCT/EP2013/077707

(51) Int. Cl.
*G01R 15/24* (2006.01)
*G01R 19/32* (2006.01)

(52) U.S. Cl.
CPC ......... *G01R 15/241* (2013.01); *G01R 15/246* (2013.01); *G01R 15/247* (2013.01); *G01R 19/32* (2013.01)

(58) Field of Classification Search
CPC .. G01R 15/241; G01R 15/246; G01R 15/247; G01R 19/32
See application file for complete search history.

(56) References Cited

U.S. PATENT DOCUMENTS 4,787,741 A    11/1988 Udd et al.
5,365,338 A    11/1994 Bramson
(Continued)

FOREIGN PATENT DOCUMENTS

CA    1276274 C    11/1990
CA    2762350 A1   11/2010
(Continued)

OTHER PUBLICATIONS

The State Intellectual Property Office of People's Republic of China, First Office Action issued in corresponding Chinese application No. 201480075945.8, dated Jul. 26, 2018, 26 pp.
(Continued)

*Primary Examiner* — Dominic E Hawkins
(74) *Attorney, Agent, or Firm* — Sage Patent Group

(57) ABSTRACT

A fiber optic sensor and related method are described, with the sensor including a cross-coupling element in the optical path between a polarizing element and a sensing element, but separated from the sensing element itself; with the cross-coupling element generating a defined cross-coupling between the two orthogonal polarization states of the fundamental mode of a polarization maintaining fiber guiding light from the light source to the sensing element thus introducing a wavelength-dependent or temperature-dependent sensor signal shift to balance wavelength-dependent or temperature-dependent signal shifts due to other elements of the sensor, particularly signal shifts due to the wavelength dependence of the Faraday effect or the electro-optic effect constant.

20 Claims, 8 Drawing Sheets

Related U.S. Application Data continuation of application No. PCT/EP2014/078782, filed on Dec. 19, 2014.

(56) References Cited

U.S. PATENT DOCUMENTS

| | | | |
|---|---|---|---|
| 5,631,559 A * | 5/1997 | Oliver | G01B 11/18 |
| | | | 324/175 |
| 5,684,590 A | 11/1997 | Sanders et al. | |
| 5,696,858 A * | 12/1997 | Blake | G01R 15/246 |
| | | | 250/227.18 |
| 5,895,912 A | 4/1999 | Bosselmann et al. | |
| 6,016,053 A | 1/2000 | Yakymyshyn et al. | |
| 6,515,467 B1 | 2/2003 | Bosselmann et al. | |
| 6,628,869 B2 | 9/2003 | Bohnert et al. | |
| 6,636,321 B2 | 10/2003 | Bohnert | |
| 6,734,657 B2 * | 5/2004 | Bohnert | G01R 15/24 |
| | | | 324/96 |
| 7,227,644 B2 | 6/2007 | Anson et al. | |
| 7,515,271 B2 | 4/2009 | Greening et al. | |
| 7,692,420 B2 | 4/2010 | Bohnert et al. | |
| 8,836,950 B2 * | 9/2014 | Sasaki | G01D 5/35322 |
| | | | 356/483 |
| 8,890,508 B2 | 11/2014 | Blake et al. | |
| 2003/0095262 A1 * | 5/2003 | Blake | G01D 5/35303 |
| | | | 356/477 |
| 2003/0108081 A1 | 6/2003 | Ryu et al. | |
| 2007/0097374 A1 | 5/2007 | Ren-Young | |
| 2008/0297898 A1 | 12/2008 | Martin | |
| 2009/0039866 A1 | 2/2009 | Bohnert et al. | |
| 2009/0122317 A1 | 5/2009 | Ito et al. | |
| 2009/0290165 A1 | 11/2009 | Bohnert et al. | |
| 2011/0050207 A1 | 3/2011 | Bohnert et al. | |
| 2011/0072858 A1 | 3/2011 | Wueest et al. | |
| 2011/0128990 A1 * | 6/2011 | Wu | G01K 11/32 |
| | | | 374/161 |
| 2011/0141478 A1 | 6/2011 | Sasaki et al. | |
| 2012/0091991 A1 * | 4/2012 | Konno | G01R 15/246 |
| | | | 324/95 |
| 2012/0283969 A1 * | 11/2012 | Bohnert | G01R 35/00 |
| | | | 702/64 |
| 2013/0069628 A1 | 3/2013 | Konno et al. | |
| 2013/0234698 A1 * | 9/2013 | Dorner | G01R 15/246 |
| | | | 324/96 |
| 2013/0251299 A1 | 9/2013 | He et al. | |
| 2014/0070802 A1 | 3/2014 | Yamada et al. | |
| 2014/0247095 A1 | 9/2014 | Edwards et al. | |
| 2015/0115934 A1 | 4/2015 | Mueller et al. | |

FOREIGN PATENT DOCUMENTS

| | | |
|---|---|---|
| CN | 1076023 A | 9/1993 |
| CN | 1407343 A | 4/2003 |
| CN | 101813238 A | 8/2010 |
| CN | 102096154 A | 6/2011 |
| DE | 4224190 A1 | 1/1994 |
| EP | 1107029 A2 | 6/2001 |
| EP | 1115000 A2 | 7/2001 |
| EP | 1154278 A2 | 11/2001 |
| EP | 2306212 A1 | 4/2011 |
| WO | 2007121592 A1 | 11/2007 |
| WO | 2008077255 A1 | 7/2008 |
| WO | 2009080109 A1 | 7/2009 |
| WO | 2011069558 A1 | 6/2011 |
| WO | 2011154029 A1 | 12/2011 |

OTHER PUBLICATIONS

National Intellectual Property Administration, PR China, Second Office Action issued in corresponding Chinese application No. 201480075945.8, dated Jun. 13, 2019, 30 pp.

European Patent Office, International Search Report & Written Opinion issued in corresponding Application No. PCT/EP2014/078782, dated Apr. 8, 2015, 10 pp.

European Patent Office, International Search Report & Written Opinion issued in corresponding Application No. PCT/EP2013/077707, dated Oct. 7, 2014, 10 pp.

G. Frosio and R. Dandliker, "Reciprocal reflection interferometer for a fiber-optic Faraday effect current sensor," Applied Optics, vol. 33, pp. 6111-6116, 1994.

K. Bohnert, et al., "Temperature and vibration insensitive fiber-optic current sensor," Journal of Lightwave Technology, vol. 20, pp. 267-276, 2002.

A.H. Rose, et al., "Verdet constant dispersion in annealed optical fiber current sensors," Journal of Lightwave Technology, vol. 15, pp. 803-807, 1997.

J.L. Cruz, et al., "Farady effect in standard optical fibers: dispersion of the effective Verdet constant," Applied Optics, vol. 35, pp. 922-927, 1996.

R.C. Jones, "A new calculus for the treatment of optical systems," J.O.S.A., vol. 31, pp. 488-493, 1941.

H. Lin, et al., "Modified in-line Sagnac interferometer with passive demodulation technique for environmental immunity of a fiber-optic current sensor," Applied Optics, vol. 38, pp. 2760-2766, 1999.

F. Briffod, et al., "Polarimetric current sensor using an in-line Faraday rotator," IEICE Transactions on Electronics E Series C, vol. 83, pp. 331-335, 2000.

K. Bohnert, et al., "Fiber-optic current sensor for electrowinning of metals," Journal of Lightwave Technology, vol. 25, pp. 3602-3609, 2007.

S. Wildermuth, K. Bohnert, and H. Brandle, "Interrogation of a birefringent fiber sensor by non-reciprocal phase modulation," IEEE Photonics Technology Letters, vol. 22, pp. 1388-1390, 2010.

X. Feng, L. Li, X. Wang, C. Zhang, J. Yu, and C. Li, "Birefringence elimination of bismuth germanate crystal in quasi-reciprocal reflective optical voltage sensor," Applied Optics, vol. 52, pp. 1676-1681, 2013.

K. Bohnert, P. Gabus, H. Brandle, and A. Kahn, "Fiber-optic current and voltage sensors for high-voltage substations," in 16th Int. Conference on Optical Fiber Sensors, Nara, Japan, Oct. 13-17, 2003, Technical Digest, pp. 752-755.

T. Mitsui, K. Hosoe, H. Usami, and S. Miyamoto, "Development of fiber-optic voltage sensors and magnetic field sensors," IEEE Trans. Power Delivery, 2, 87-93, 1987.

X. Wang, S. Chen, Z. Du, X. Wang, C. Shi, and J. Chen, "Experimental Study of Some Key Issues on Fiber-Optic Interferometric Sensors Detecting Weak Magnetic Field," IEEE Sensors Journal 8, 1173-1179, 2008.

K. Bohnert, M. Ingold, and J. Kostovic, "Fiber-Optic Voltage Sensor for SF6 Gas-Insulated High-Voltage Switchgear," Applied Optics, vol. 38, pp. 1926-1932, 1999.

* cited by examiner

FIBER-OPTIC SENSOR AND METHOD

FIELD OF THE INVENTION

The invention relates to a fiber optical sensor such as a fiber-optic current sensor (FOCS) or magnetic field sensor that includes a sensing fiber to be exposed to a magnetic field, e.g. of a current to be measured, or such as a fiber-optic voltage sensor, both typically used in high voltage or high current applications.

BACKGROUND OF THE INVENTION

Fiber-optic current sensors rely on the magneto-optic Faraday effect in an optical fiber that is coiled around the current conductor. The current-induced magnetic field generates a circular birefringence in the optical fiber that is proportional to the applied magnetic field. A preferred arrangement employs a reflector at the sensing fiber's far end so that the light coupled into the fiber performs a round trip in the fiber coil. Commonly, left and right circularly polarized light waves, which are generated from two orthogonal linearly polarized light waves by a fiber-optic phase retarder spliced to the sensing fiber and acting as quarter-wave retarder (QWR), are injected into the sensing fiber as described in the references [1-4]. After the round trip through the fiber coil the two circular waves have accumulated a phase delay proportional to the applied current as a result of the circular birefringence in the fiber. This phase delay is proportional to the number of fiber windings around the current conductor, the applied electrical current, and the Verdet constant $V(T, \lambda)$ of the fiber. The Verdet constant is thereby material-, temperature-, and wavelength-dependent.

As an alternative, the sensor may be designed as a Sagnac-type interferometer with quarter-wave retarders (QWRs) at both sensing fiber ends and light waves of the same sense of circular polarization that are counter-propagating in the sensing fiber.

In references [3, 5, 6] methods are disclosed where the fiber retarder is employed to balance the temperature dependence of the Verdet constant, which is $(1/V) \, dV/dT = 0.7 \times 10^{-4}$ °C.$^{-1}$ for fused silica fiber. For this purpose, the retardance of the QWR is set to an appropriately chosen value that commonly deviates from perfect quarter-wave retardance. The variation of the retardance with temperature changes the sensor scale factor such that it balances the variation of the Verdet constant with temperature. A method how to manufacture such retarders is disclosed in reference [7].

Typically, fiber-optic current sensors employ semiconductor light sources such as superluminescent diodes (SLDs). If the source is not temperature stabilized, its emission spectrum shifts to smaller wavelengths at increasing ambient temperature. Typical SLD wavelength shifts correspond to a few tenths of a nanometer per °C. depending on details of the SLD material system. The Verdet constant for fused silica fiber roughly scales with wavelength as $V(\lambda) = V(\lambda_0) (\lambda_0/\lambda)^2$, as stated for example in references [8, 9]. Here, $\lambda_0$ is the initial wavelength (reference wavelength). The relative scale factor variation at 1310 nm is thus −0.15%/nm or −0.05%/° C., if one assumes a wavelength shift with temperature of 0.3 nm/° C. Apart from the Verdet constant, other sensor parameters may also change with source wavelength, for example the retardance of the fiber retarder at the beginning of the sensing fiber, and may thus influence the scale factor. The source wavelength also varies with drive current or may shift as a result of source aging.

To counter the shift in wavelength it is known to stabilize the wavelength of light source by operating the source at constant current and stabilizing the source temperature by means of a thermoelectric cooler (TEC) or by monitoring the source temperature and appropriately correcting the sensor signal. Wavelength shifts due to source aging are not corrected when using these methods.

In the field of fiber-optic gyroscopes, several methods have been reported to track wavelengths shifts in gyroscopes, including the use of a tracking interferometer [10], wavelength division multiplexers [11-13], or fiber gratings [12, 14].

Further known are voltage or electric field sensors based on the Pockels effect or linear electrooptic effect or on the use of an optical fiber coupled to a piezo-electric material. In these sensors, birefringence induced by the electric field or by force or anisotropic change in the refractive index of the material is used in the fiber optic sensor to measure voltages, electric field strength or force.

As discussed above, references [3, 5, 6] disclose how to compensate a temperature dependence of a fiber-optic current sensor. Hereby, generally, a first-order, i.e. linear, temperature-dependent contribution that e.g. originates from the temperature dependence of the Verdet constant $(dV/[VdT]) = 0.7 \times 10^{-4}$ °C.$^{-1}$ in fused silica fiber at 1310 nm) is counteracted by a temperature-dependent behaviour of a fiber retarder at the entrance to the sensing fiber. WO 2014/154299 further discloses how to compensate a temperature dependent signal that originates from a combination of the temperature dependence of the Verdet constant and the birefringence of the sensing fiber. However, these methods generally do not compensate a potential higher order, in particular second order, i.e. parabolic or quadratic, temperature dependence or can even introduce an additional higher order temperature dependence. Depending on the detection method of the sensor (detection with non-reciprocal phase modulation or detection with passive phase bias), the curvature of the parabolic contribution can either be positive or negative. A non-linear contribution can also originate from polarization cross-coupling due to packaging-related fiber stress at extreme temperatures or temperature-dependent shifts of the optimum sensor working point, as e.g. shown in WO 2014/006121. U.S. Pat. No. 5,696,858 discloses a fiber-optic sensor according to the precharacterizing clause of the independent claims.

It is an object of the invention to provide a fiber optic sensor, particularly a magnetic field sensor or current sensor that includes a sensing fiber to be exposed to a magnetic field, where the sensor signal is less sensitive to wavelength shifts of the light used and/or to temperature shifts.

SUMMARY OF THE INVENTION

Hence, according to a first aspect of the invention, a fiber optic sensor is provided including a light source, a polarizing element, a detector, a polarization maintaining (PM) fiber, and a sensing element, with the sensor further including a cross-coupling element in the optical path between the polarizing element and the sensing element but not directly connected to the sensing element, with the cross-coupling element generating a defined cross-coupling between the two orthogonal polarization states of the fundamental mode of the PM fiber.

The sensor can be a magnetic field or current sensor, in which case the sensing element is preferably a sensing fiber to be looped around a conductor and in operation exposed to a magnetic field of the current in the conductor. Alternatively, the sensor can be an electric field or voltage sensor, in which case the sensing element is preferably an electro-optical crystal or a fiber force-coupled to a piezo-electric element. For force or strain measurements the fiber can be directly coupled to the object exerting the force or the strained object.

The polarizing element can be a light source inherently generating light with the desired polarization or it can be a part of the sensor separate from the light source such as a polarizing fiber, a polarizing beam splitter, (fiber-coupled) bulk optic polarizer, a polarizing waveguide, such as a lithium niobate ($LiNbO_3$) waveguide made by proton exchange, and combinations thereof.

In general, the cross-coupling element can be introduced into the optical path at any point in which it can provide the cross-coupling effect between the two polarization states of the PM fiber. However, it is preferred not to locate the element too closely to the entry point of the light into the sensing fiber. In particular, the cross-coupling is not directly attached to the sensing element, but best is separated from it at least by a section of PM fiber and/or by at least by a retarder and/or by a Faraday rotator, i.e. is separated by at least one element selected from the group consisting of: at least a section of PM fiber, a retarder, a Faraday rotator, and combinations thereof.

It is preferred to introduce the cross-coupling element into the optical circuit at a location closer to the proximate end of the PM fiber than its distal end. If the sensor includes further active or passive elements to modulate or bias the phases of the light before it enters a detector, such as optical modulators or passive phase retarders, it is particularly preferred to have the cross-coupling element in proximity to these further active or passive elements.

Most preferably, the cross-coupling element is integrated between two sections of the PM fiber or, where present in the sensor, directly attached to or integrated within an optical beam splitter element located in the light path between the light source and the PM fiber.

The cross-coupling element is a separate element present in addition to the PM fiber, in particular in addition to a non-ideal PM fiber having residual cross-coupling between orthogonal polarizations. In other words, the cross-coupling element introduces deliberate specific cross coupling between the orthogonal light polarizations propagating into the PM fiber. Such purposeful cross coupling can add to practically present cross-coupling in the optical circuit that results from non-ideal optical elements, such as PM fibers, polarizers, splices, retarders, modulators, etc.

In embodiments, the cross-coupling element introduces a wavelength dependent part in the sensor signal that can be tuned such that shifts in the sensor signal, in particular in its scale factor, introduced by the wavelength dependent cross-coupling balance other changes in the sensor signal caused by shifts of the center wavelength λ of the light, in particular a change in the Verdet constant of the sensing element.

The cross-coupling element can be implemented in form of a non-exact half-wavelength retarder. The (non-exact) half-wavelength retarder introduces a phase shift of m·180°+β(λ) between the two polarization states of the PM fiber, wherein m is an integer including zero and β(λ) is not zero and selected such that a shift of the center wavelength λ away from its initial value λo does not affect the signal as measured.

Often, it is particularly preferred to have further active or passive elements, such as optical modulators or beam splitters, and in some variants also the light source and or/the detectors, together with the cross-coupling element at the same location. In high voltage environment a location on ground potential is often preferred. Thus, it is possible to house both the further active or passive elements, such as optical modulators or beam splitters and in some variants also the light source and or/the detectors, and the cross-coupling element in a single housing, or at least sharing the same electrical supply line, so as to facilitate having a controlled temperature environment to reduce influence of temperature on the cross-coupling element, even if the cross-coupling element has its own temperature controlled housing separated from the other active or passive elements.

Alternatively or in addition to such external temperature stabilization, the coupling element can be stabilized inherently against temperature fluctuations, e.g. by detuning of an additional retarder in the optical path, particularly a retarder located at the entry to the sensing element, or by using several parts in the cross-coupling element with mutually counter-acting temperature dependences.

In embodiments of the sensor or method, the cross-coupling element is a half wave retarder with principal axes forming an orientation angle ζ in a range of ±15° or in a range of 90°±15° with respect to the principal axes of the PM fiber, and with a half wave retardance $\delta(T_0, \lambda_0)$ equal to an integer multiple of 180° within ±20° to achieve a sensor signal insensitive to temperature up to second order within a given temperature range.

In embodiments of the sensor or method, a retarder is adjusted to compensate for linearly temperature-dependent shifts in the sensor signal caused by temperature changes of any of the elements selected from the group consisting of: the cross-coupling element, the sensing element, further optical elements in the sensor; in particular wherein the retarder introduces a quadratically temperature-dependent shift in the sensor signal.

In embodiments of the sensor or method, a quadratically temperature-dependent contribution from the cross-coupling element to the sensor signal counteracts a quadratically temperature-dependent contribution from other elements, in particular from the retarder, to the sensor signal.

Though other types of fiber-optic sensors using for example a Sagnac-type configuration can be adapted to include elements of the present invention in case of it being a current sensor, it is preferred that such a current sensor is of the reflective type. The sensing element or fiber in such a sensor is terminated with a reflective element, such as a reflector or a Faraday rotator mirror.

Due to the improved stabilization against shifts in the nominal wavelength λ of the novel sensor, the light source used can be of a non-temperature-stabilized type. Such light sources typically lack an active heating or cooling element in close proximity of the light emitting element, i.e. integrated into the so-called packaging of the light emitting element.

Sensors in accordance with the invention are of particular use in the field of measurements in a high-voltage environment (e.g. in the range of 72 kV to 800 kV) in power transmission networks, where accurate measurement, long lifetimes and robustness in widely varying environmental conditions are required.

Further aspects of the invention include a method of measuring a current, a magnetic field, a voltage, an electrical field, a force field or a strain field using a fiber-optic sensor and introducing a wavelength dependent shift of the signal by tuning a cross-coupling between the two polarization states of a PM fiber with the cross-coupling element introduced into the optical path between a polarizing element for the injected light and the sensing element of the sensor or between the polarizing element and any optical elements located at the entry point of the sensing fiber and directly attached to it.

In the method: the amount of tuning is selected such that wavelength-dependent shifts in the sensor signal introduced by the cross-coupling balance other wavelength-dependent shifts in a measured signal as caused by shifts of the centre wavelength of the light. Such shifts can include wavelength dependent shifts in the Verdet constant or in other optical elements, such as retarders and the like, of the sensor; and/or in the method the amount of tuning is selected such that temperature-dependent shifts in the sensor signal introduced by the cross-coupling balance other temperature-dependent shifts in a measured signal. Such shifts can include or can be linearly and/or quadratically temperature-dependent shifts from the quarterwave retarder or from other optical elements (i.e. different from the cross-coupling element) of the sensor.

In embodiments, the cross-coupling element located in the optical path between the polarizing element and the sensing element is used to balance signal shifts introduced by a quadratic temperature dependence due to other sensor elements by such shifts in the sensor signal that are introduced by a quadratic temperature dependence of the cross-coupling element. In alternative or additional embodiments, the cross-coupling element located in the optical path between the polarizing element and the sensing element is used to balance signal shifts introduced by a linear temperature dependence due to other sensor elements by such shifts in the sensor signal that are introduced by a linear temperature dependence of the cross-coupling element.

In embodiments, the cross-coupling element for balancing wavelength-dependent shifts and the cross-coupling element for balancing temperature-dependent shifts can be the same or can be different cross-coupling elements.

Even more preferably, the tuning of the cross-coupling between the two polarization states of the PM fiber includes the step of introducing a phase shift of $m \cdot 180° + \beta(\lambda_0)$ between the two polarization states, wherein m is an integer including zero and $\beta(\lambda_0)$ is not zero and is selected to balance wavelength-dependent shifts in a measured signal.

Another aspect of the invention is a fiber-optic sensor voltage or electric field sensor with at least a light source and at least two light detectors, at least three optical transmission channels, with one channel providing a forward channel for the light to a sensing element and two channels providing return detector channels for the light to the detectors, and an integrated optical polarization splitter module for introducing a static bias optical phase shift between two different sets of light waves, having different velocities within said sensing element in the presence of a non-vanishing measurand field and for converting a total optical phase shift including the static bias optical phase shift and an optical phase shift induced by the measurand field into optical power changes of opposite signs (anti-phase) in the at least two detector channels, and a polarization maintaining (PM) fiber with the PM fiber being connected directly or indirectly via at least one retarder or Faraday rotator element to the sensing element.

The two different sets of light waves can be for example orthogonal linear polarization modes or left and right circular polarization modes. Preferably, such a sensor includes a cross-coupling element for wavelength stabilization as described above.

For optical magnetic field sensors or current sensors according to this invention, the sensing element can comprise optical fibers or waveguides, including specialty low birefringent fibers, flint glass fibers, or spun highly-birefringent fibers, bulk magneto-optic materials, such as yttrium iron garnet crystals or fused silica glass blocks, or optical fibers, waveguides, or bulk optical materials attached to a magneto-strictive element [31], or combinations thereof.

For voltage or electrical field measurements according to this invention, the sensing element can comprise an electro-optical crystal, a crystalline electro-optic fiber (see ref. [24]), a poled fiber [25], or a fiber or bulk optic material attached to a piezo-electric element [32]. For force or strain measurements according to this invention, the sensing element can comprise an optical fiber or a bulk optic material.

A further aspect of the disclosed device (as already mentioned above for the method), that can be used as addition or alternative to the previous aspects, is a compensation of a quadratic temperature dependence and/or of a residual linear temperature dependence in fiber-optic sensors, in particular fiber-optic current sensors. Equally, this invention applies to fiber-optic strain or voltage sensors. To this end, a cross-coupling element is inserted into the optical circuit of a fiber-optical sensor as described with respect to other aspects of the disclosed invention: The cross-coupling element is placed between a polarizing element and the sensing element, e.g. between two sections of polarization maintaining fiber, but is not directly coupled to the sensing element. The polarizing element can be selected from the range of choices as described with respect to other aspects of the disclosed invention. Equally, the cross coupling element is preferably separated from the sensing element by at least a section of PM fiber, a retarder (in particular a fiber retarder), a Faraday rotator, or a combination of such elements. To expose the introduced cross-coupling element to a similar or the same temperature as the sensing element and an optional fiber retarder attached to the sensing element, the cross-coupling element is preferably in spatial proximity to the sensing element and the optional fiber retarder. In embodiments, the cross-coupling element, the sensing element and the fiber can retarder can share a common housing.

The cross-coupling element adds a temperature dependent signal component due to temperature dependent cross-coupling between the two orthogonal linearly polarized light states of the polarization-maintaining fiber, whose temperature dependence counteracts the residual combined temperature dependence of the sensing element, an optional fiber retarder or Faraday rotator, and, if applicable, further components in the optical path. Hereby, preferably, in the case of fiber-optic current sensors, the parameters of the fiber retarder are chosen such that the linear terms in the temperature dependence of the sensing element and the retarder cancel each other, e.g. in a range from −40° C. to 85° C., while a higher-order temperature dependence remains.

However, in this further aspect of the invention, the temperature dependent contribution of the cross-coupling element is chosen to compensate the residual parabolic or quadratic temperature dependence.

In other cases, the cross-coupling element can counteract a combination of residual quadratic and linear temperature dependence of the signal. In general, the temperature dependent variation of the signal to-be-compensated can e.g. originate from the temperature dependence of mechanical stress exerted on the sensing element, of bend-induced birefringence in a sensing fiber, of the magneto-optic or electro-optic effect of the sensing element, of the piezo-electric effect of a piezo-electric material attached to the sensing element, of the intrinsic birefringence in the sensing element such as in a spun highly-birefringent optical fiber, of the working point of the sensor, of a retarder or a Faraday rotator in the optical path, or of combinations thereof.

The cross-coupling element can be implemented in form of an exact or non-exact half-wave retarder, i.e. with a retardation δ(T,λ) with T=temperature and λ=wavelength. In an embodiment, the retardation is set to δ(T$_0$,λ$_0$)=m·180°, with m being an odd integer number, T$_0$ being a reference temperature, typically in the middle of the operating temperature range, and λ$_0$ being the mean operating wavelength. In this embodiment, the principal axes of the retarder are oriented under 0°+ζ or 90°+ζ with respect to the incoming light polarizations, e.g. given by the principal axes of a polarization maintaining fiber link into which the cross-coupling element 16 is inserted. The orientation angle ζ and integer m are then adjusted to compensate a quadratic temperature dependence, introduced by other components of the optical circuit of the fiber-optical current sensor. This adjustment of m and ζ is chosen as a function of the variation of retardance δ(T$_0$,λ$_0$) with temperature and of the amount of quadratic temperature dependence to be compensated for.

Please note that in general throughout this application, the half wave retardance δ(T$_0$,λ$_0$)=m·180°+β(m=0, 1, 2, 3, . . . ) with β being the deviation or detuning of the non-exact half wave retardance from the exact half wave retardance of multiple orders m of 180°.

In another aspect of the disclosed invention, two cross-coupling elements can be included in the optical path of the fiber-optic sensor (not shown). A first cross-coupling element can be used for compensation of the wavelength dependence of the sensor signal, while a second cross-coupling element can be introduced to compensate a residual temperature dependence of the sensor signal, in particular a quadratic temperature dependence. The first cross-coupling element is preferably designed as disclosed in the primary aspect of the invention, while the second cross-coupling element is designed as described in the other inventive aspect of quadratic temperature dependence compensation. In embodiments, the first cross-coupling element resides in a common housing with the opto-electronic module or with at least parts of the opto-electronic module, while the second cross-coupling element resides in a common housing with the sensing element.

The above and other aspects of the present invention together with further advantageous embodiments and applications of the invention are described in further details in the following description and figures.

DETAILED DESCRIPTION

Figure 1:
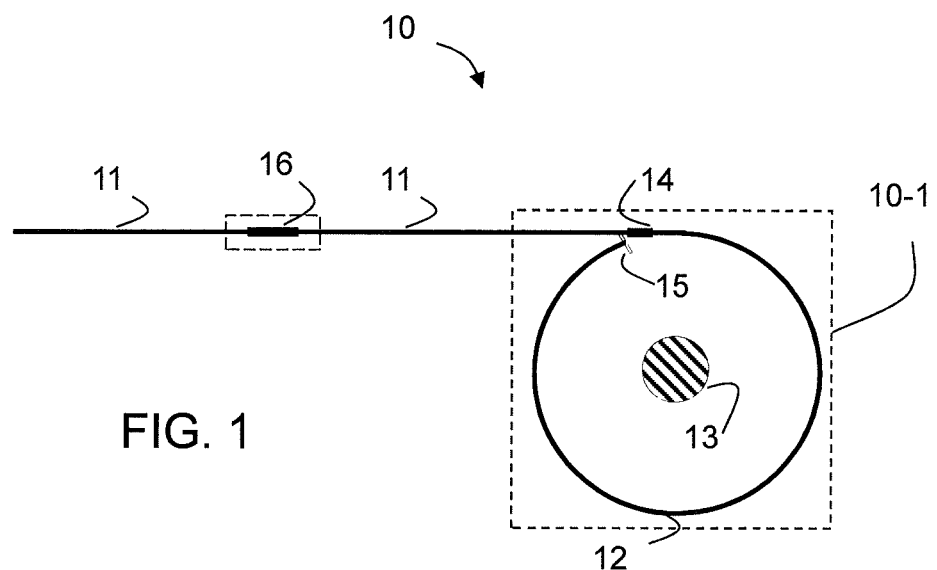
FIG. 1 is a schematic diagram of a fiber optic sensor head connected to a PM fiber of a sensor in accordance with an example of the invention.

In FIG. 1 there is shown a general example of the present invention illustrating configurations of the sensor head 10-1 of a reflective fiber-optic current sensor 10 in a schematic manner. In this general example, a polarization maintaining (PM) fiber lead 11 transfers the light into and back from the sensor head which includes a sensing element 12 being in this example a sensing fiber 12 wound in one or more (N) loops around a conductor 13. Depending on the method of measuring the magneto-optic phase shift, either a superposition of light in both of the two orthogonal polarization states of the fundamental PM fiber mode or only light in one polarization state is injected into the sensing fiber element 12.

Depending on the specific detection technique the linearly polarized light waves may be converted to circular waves before they enter the sensing fiber by using a retarder 14, which in the present example is a fiber-optic QWR (quarter-wave retarder), located at the transition from the PM fiber 11 to the sensing fiber 12. A reflector 15 terminates the sensing fiber 12 at one end. The reflector 15 can for example be a standard mirror (e.g. a reflective coating 15 on the fiber tip) or a Faraday rotator mirror 15'. In certain sensors with rotator mirrors, the retarder 14 is omitted or implemented as a (detuned) half-wavelength retarder.

In case where the sensor is a voltage sensor 90, the sensor head 10-1 as shown can be replaced by a different sensor head, in which the sensing fiber is replaced as the sensing element 12 for example by an electro-optic crystal to measure a voltage ΔV applied over the length of the crystal, as detailed in FIG. 9 below.

If a temperature compensation of the sensor 10 is desired, the retarder 14 can be detuned by an angle ε to (M·180°+90°+ε) in case of a quarter-wave retarder (or (M·180°+ε) in case of a half-wave retarder as described for example in the references [3, 5, 6].

Also shown in FIG. 1 is an element 16 located in the example between two sections of the PM fiber 11. The element 16 is designed to cause a defined amount of cross-coupling between the two polarization states of the PM fiber 11.

In the context of the present invention the term "cross-coupling" means that light which has propagated in one polarization state of the fundamental mode, e.g. LP$_{01}$(x), before the cross-coupling element 16 is split onto both states, LP$_{01}$(x) and LP$_{01}$(y).

It should be noted that this element 16 need not be located between sections of the PM fiber 11 to achieve such a cross-coupling, but instead can be located anywhere in the optical path between an initial linear polarizer and the sensing element 12 (though not directly coupled to its proximate end), for example between the linear polarizer and PM fiber 11, or between PM fiber 11 and retarder 14. In embodiments where a light source generates directly light with the desired polarization, such as specifically designed laser, such a light source is understood to include the initial polarizer.

Figure 2A:
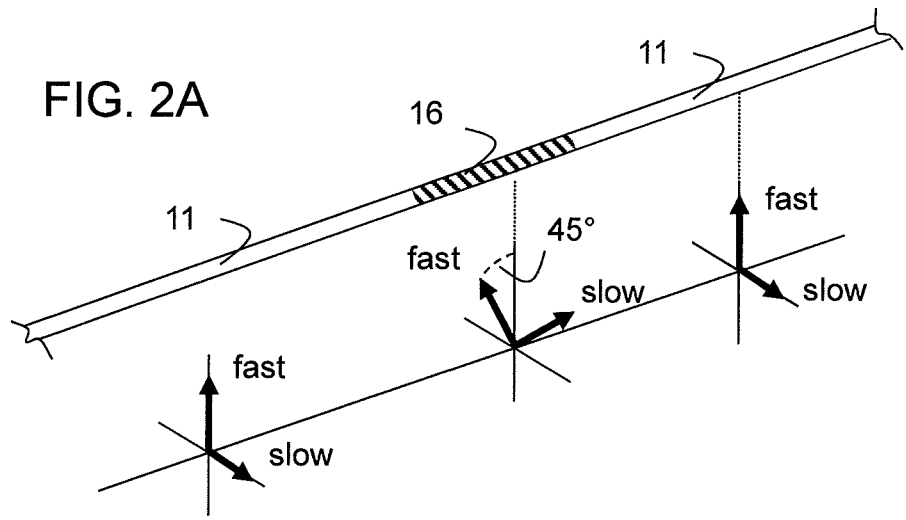
FIG. 2A illustrates a cross-coupling by using a non-exact half-wavelength fiber retarder in a PM fiber.
Figure 2B:
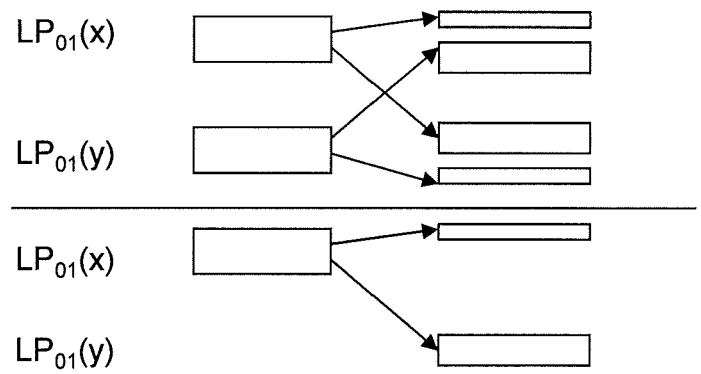
FIG. 2B illustrates the function of a cross-coupling element.

Details of an example of the cross-coupling element 16 and its function are illustrated in FIGS. 2A and 2B. In FIG. 2A the cross-coupling element 16 is shown as a non-achromatic fiber-optic retarder integrated within the PM fiber 11. Below the illustration of the fiber 11, there is shown a graph indicating the relative orientation of fast and slow axes of the fiber retarder 16 with respect to the principal axes of the PM fiber 11. The orientation and in particular the length (i.e. the differential phase retardance between the orthogonal polarization states) of the retarder 16 is designed to cause a controlled amount of polarization cross-coupling (or mode mixing) between the two orthogonal polarization states of the fundamental mode of the PM fiber 11, $LP_{01}(x)$ and $LP_{01}(y)$, as indicated in FIG. 2B for sensors using both orthogonal polarization states (upper half of FIG. 2B) or sensors using only one polarization state (lower half of FIG. 2B).

The cross-coupling changes the scale factor (or sensitivity) of the sensor 10 in a defined manner. Since the retardance of the retarder 16 and thus the cross-coupling varies with wavelength, it can be used to compensate for variations in the Verdet constant and other sensor parameters which change when drifts in the wavelength of the light occur. The phase retardance $\delta$ of the retarder 16 at the center wavelength is set in this example to $m \cdot 180° + \beta (m=0, 1, 2, 3, \ldots)$, with m=0 being a possible choice when $\beta > 0$.

It should be noted that if the retarder 16 were an exact zero-order or multiple order half-wave retarder (i.e. $\beta = 0$) there would be no additional cross coupling between the orthogonal modes of the PM fiber lead. As the retardance achieved with the cross-coupling element 16 varies with the actual wavelength, $\beta$ can be set to compensate for a change in the sensor signal, in particular of its scale factor, due to the change of the Verdet constant with wavelength. The method can also compensate the wavelength dependence of other elements in the optical path, in particular of the retarder 14 at the entrance to the sensing fiber 12 as shown in FIG. 1 above.

The compensation of the wavelength dependence as described above can be integrated in all fiber-optic current sensor configurations, in which a PM fiber lead transfers the light to the sensing fiber and/or from the sensing fiber. In the reflective sensor configurations of FIG. 1 the cross-coupling occurs both during the forward and return travel of the light.

Figure 5:
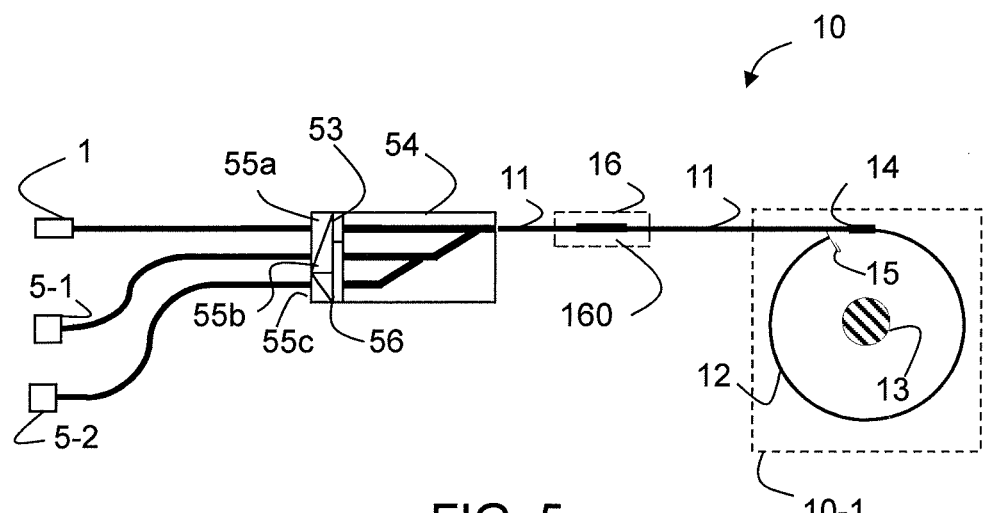
FIG. 5 is an example of the invention as used in sensors of a reflective type with passive optical elements for signal detection.
Figure 6:
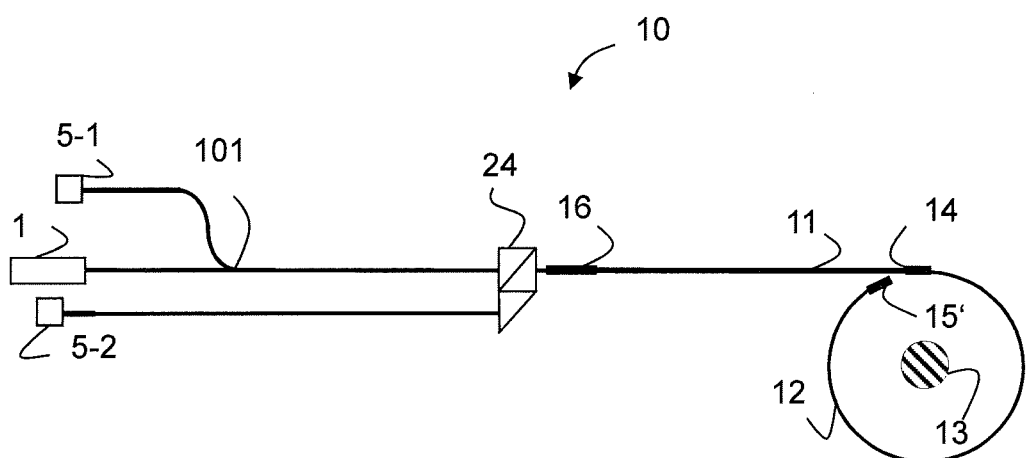
FIG. 6 is another example of the invention as used in sensors of a reflective type with passive optical elements for signal detection and a Faraday rotator mirror as terminal of the sensing element.

In the following, there is shown in greater detail, how the cross-coupling element 16 can be integrated into three distinct sensor configurations: a fiber-optic current sensor with non-reciprocal phase modulation for phase biasing (illustrated in FIGS. 3), a fiber-optic current sensor with a quarter-wave retarder for passive phase biasing (FIG. 5), and a fiber-optic current sensor with a Faraday rotation mirror for passive phase biasing (FIG. 6).

These designs differ in how the magneto-optical birefringence in the sensing fiber is detected and with the cross coupling element 16 being adapted accordingly.

Figure 3A:
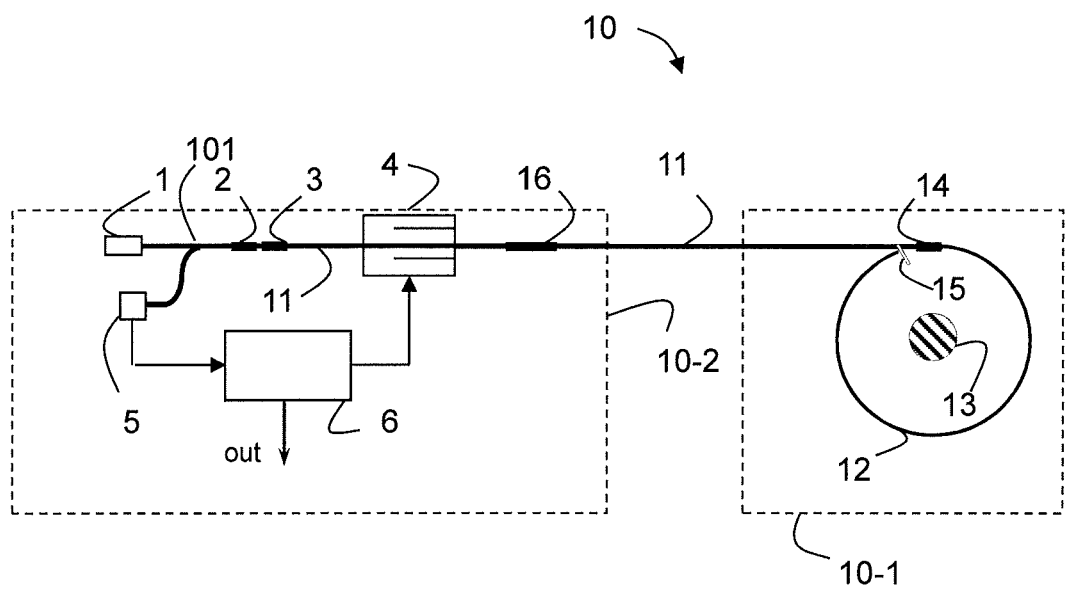
FIGS. 3A and 3B illustrate examples of the invention as used in sensors of a reflective type with active phase modulation for signal detection.

In a fiber-optic current sensor design with non-reciprocal phase modulation, as shown in FIG. 3A, light is injected, preferably from a low coherent light source 1 such as a superluminescent diode, after passing through an optical fiber, a fiber coupler 101 and an initial optical fiber polarizer 2, which reduces the emitted light into a single linear polarized state, injected at a 45° fiber splice 3 into both orthogonal polarization states of the PM fiber 11, which in turn are projected onto circular or close to circular light states in the sensing fiber 12 by a fiber-optic retarder 14. The two light states in the sensing fiber 12 acquire a magneto-optic phase delay due to the applied electrical current (Faraday effect). The phase delay is detected by means of a closed-loop detection circuit that includes an optical phase modulator 4 and a detector 5 linked to the optical path by the fiber coupler 101. The optical phase modulator 4 and the detector 5 are also electrically linked through a signal processor 6 for the closed loop detection. Alternatively, an open-loop detection circuit may be used.

It should be understood that in these as in the following examples components cited can be replaced by components with identical or similar functionality. For example, the light source 1 mentioned can be replaced by other types of light sources 1, such as light emitting diodes (LEDs), edge-emitting LEDs, vertical-cavity surface-emitting lasers (VC-SELs), doped-fiber light sources, or laser diodes. Similarly, the modulator 4 of FIG. 3A may be an integrated-optic birefringence modulator, such as a lithium niobate modulator, or a piezoelectric modulator. The latter modulates the differential phase of the orthogonal polarization states by modulating the optical length of a section of PM fiber 11 that is attached to the modulator.

As described in the references cited, the quarter-wave retarder 14 can be detuned from exact quarter-wave retardance by $\epsilon$ to achieve an intrinsic temperature compensation of the sensor (also a higher order retarder can be used, such that the retardance $\rho$ of the quarter-wave retarder amounts in total to $\rho = M \cdot 180° + 90° + \epsilon$ where $M = 0, 1, 2, 3, \ldots$), see for example references [3, 5, 6].

Figure 3B:
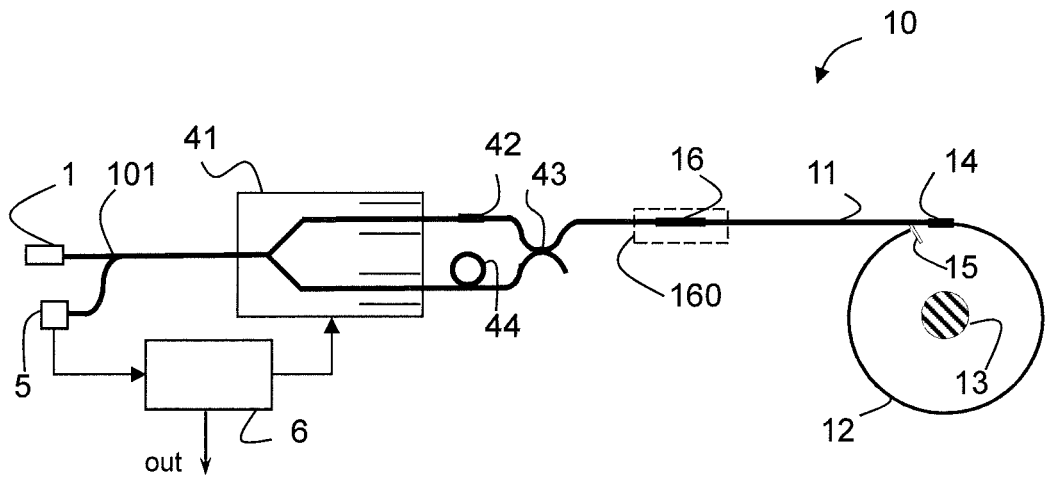

In the case of no birefringence in the sensing fiber 12 apart from the magneto-optic birefringence, the current signal at small magneto-optic phase shifts of sensors according to FIGS. 3A, 3B is in good approximation proportional to $$S \sim (-1)^M V(T, \lambda) NI / \cos \epsilon(T, \lambda) \qquad [1]$$

Here, N is the number of loops of the sensing fiber coil 12, and I the current in the conductor 13. A change in sign indicates a phase shift of 180° between the current and the resulting signal. The Verdet constant V generally varies linearly with temperature T and is a function of wavelength $\lambda$. M and $\epsilon(T_0, \lambda)$ can be chosen so that the current signal becomes independent of temperature, as done in the references mentioned above. Here, $T_0$ is a reference temperature, e.g. room temperature.

In the prior art, the wavelength is commonly kept stable by working with a temperature-stabilized light source 1. If the wavelength shifts by $\Delta\lambda$ (herein assuming $\Delta\lambda/\lambda_0 \ll 1$), the relative signal change $\Delta S/S_0$ (with $S_0$ being a central or an undisturbed signal) is given by $$\Delta S/S_0 = (-2 - \tan \epsilon(T, \lambda_0)[M \cdot 180° + 90° + \epsilon(T, \lambda_0)])\Delta\lambda/\lambda_0 \qquad [2]$$

wherein the first term, i.e. $-2\Delta\lambda/\lambda_0$, results from the wavelength dependence of the Verdet constant V, and the second term results from the wavelength dependence of the retarder 14 when assuming that the retardance of the retarders 14 varies inversely proportional to the wavelength and that the Verdet constant of the sensing fiber 12 shows quadratic dispersion as previously reported, see ref. [8]. In case of a different type of dispersion, the principle of this calculation is not altered, but the values given herein for β have to be adapted.

Eq. [2] has been derived from a description of the wave propagation in the optical circuit by means of the Jones matrix formalism, which is shown in general form in reference [15]. As noted, in the references cited above, M and $\varepsilon(\lambda_0)$ are chosen so that the overall current signal becomes nearly independent of temperature. For instance, with a temperature dependence of the Verdet constant of $C_{Verdet}=0.7 \cdot 10^{-4}$ $C^{\circ -1}$ in fused silica fiber and assuming a temperature coefficient of the retarder of $C_{QW}=-2.4 \cdot 10^{-4}$ $C^{\circ -1}$, a quarter-wave retarder having M=0 and $\varepsilon(\lambda_0)=9.5°$ results in an essentially (linearly) temperature independent signal. This sensor of prior art however still yields, according to eq. [2], a relative (combined) wavelength dependence of $\Delta S/S_0 = (-2-0.29)\Delta\lambda/\lambda_0 = -2.29\ \Delta\lambda/\lambda_0$.

This wavelength dependence can be balanced in accordance with the example shown by using a retarder as cross-coupling element 16 with retardance $m \cdot 180° + \beta(\lambda)$ arranged in the optical path of the emitted light after the polarizer 2 but before the retarder 14. In the example, the cross-coupling retarder 16 is included in the opto-electronic module 10-2 which comprises most components of the sensor 10 with the exception of the components of the sensor head 10-1 and parts of the PM fiber 11. The opto-electronic module 10-2 and the sensor head 10-1 are optically connected through the PM fiber 11. The cross-coupling element 16 can be maintained at constant temperature separately or inside a housing of the opto-electronics module 10-2.

The wavelength-dependence-compensating retarder 16 is essentially a zero or multiple order half-wave retarder (HWR) with a phase deviation $\beta(\pi)$ from perfect half-wave retardance. Using such a cross coupler 16 and assuming small magneto-optic phase shifts NVI (NVI<<1), the signal S is approximately proportional to $$S \sim (-1)^{M+m} V(\lambda) NI / [\cos \varepsilon(\lambda) \cos \beta(\lambda)] \quad [3]$$

The relative change $\Delta S_{HWR}$ in sensor signal at a wavelength change $\Delta\lambda$ resulting from the extra retarder 16 can be written as $$\Delta S_{HWR}/S_0 = -\tan \beta(\lambda_0)[m \cdot 180° + \beta(\lambda_0)]\Delta\lambda/\lambda_0 \quad [4]$$

with $\lambda_0$ being the nominal center wavelength of the sensor 10 and in particular $S_0 = S(\lambda_0)$. The integer m and the deviation or phase $\beta(\lambda_0)$ from perfect half-wave retardance can be adjusted so that the term $\Delta S_{HWR}/S_0$ of eq. [4] balances the term $\Delta S/S_0$ of eq. [2], i.e. the current signal becomes independent of wavelength.

For instance, m=2 and $\beta(\lambda_0) \approx -21°$ can be chosen to effectively compensate the wavelength dependence of the Verdet constant and of the quarter-wave retarder 14. In the above derivation it is assumed that the temperature of the compensating cross-coupling retarder 16 is kept constant or that its retardance is essentially independent of temperature. As mentioned and described below in more details, this can be for example achieved by placing the cross-coupling element 16 in a constant temperature environment.

In embodiments, already $\beta(\lambda_0) \approx -20°$ or $\beta(\lambda_0) > -20°$ (i.e. $\beta(\lambda_0)$ being less negative than $-20°$) can effect a partial (yet useful) compensation of the wavelength dependence of the Verdet constant and of the quarter-wave retarder 14.

In a variant of these examples as shown in FIG. 3B, the phase modulator 4 of the type as shown (birefringence modulator) may be replaced by a y-type integrated optic phase modulator 41 with PM fiber pig tails as often used in fiber-optic gyroscopes and a polarization-maintaining fiber coupler 43 as described in more detail in references [19, 20]. In this example, the modulator 41 also acts as initial polarizer. The two light waves with parallel polarization directions emerging from the modulator are projected onto the orthogonal linear polarization states of the pm fiber 11 by a 90°—fiber splice 42 and by the polarization-maintaining fiber coupler 43. The second arm of the modulator 41 includes an optical delay element 44.

The half-wave retarder 16 is then preferably arranged in the PM fiber link 11 between the fiber coupler 43 and the sensing fiber coil 12. Alternatively, an appropriately adjusted half-wave retarder can be placed into each of the two fiber arms between the y-modulator 41 and the PM coupler 43.

In this example, the cross-coupling element is shown in a temperature-controlled housing 160 spatially separated from the other components. This arrangement can be regarded as an alternative to including the cross-coupling element 16 in the opto-electronic module 10-2.

Figure 4:
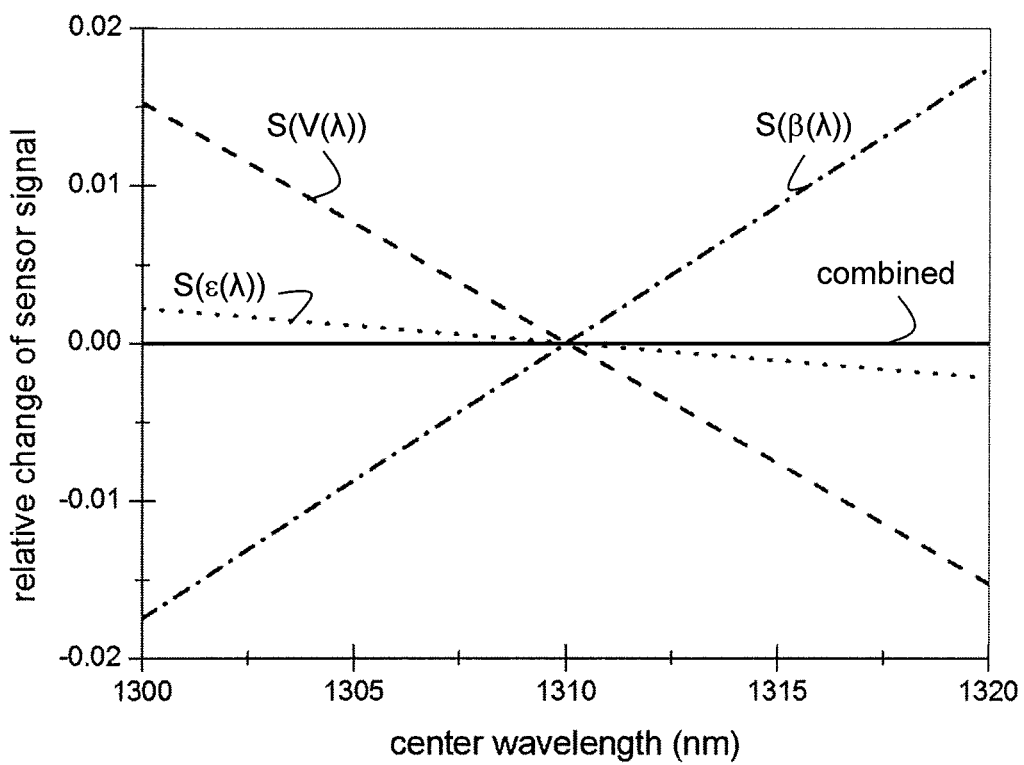
FIG. 4 is a numerical example of balancing signals shift due to shifts in the center wavelength of light by means of a polarization cross-coupling element.

In FIG. 4 there is shown the variation of sensor signal S vs. wavelength of a compensated sensor together with the individual contributions from Verdet constant $S(V(\lambda))$, the quarter wave retarder $S(\varepsilon(\lambda))$ and the compensating cross-coupling retarder $S(\beta(\lambda))$. The signal variation without compensation (combined contribution from Verdet constant and quarter-wave retarder) corresponds to 3.5% for the wavelength span (20 nm) in FIG. 4. The residual signal variation after compensation is negligible.

In a fiber-optic current sensor design with splitter and with passively generated phase bias as shown in FIG. 5, the same design for the sensor head 10-1 is used as in the previous embodiments (e.g. FIG. 1). Instead of closed-loop detection with an optical phase modulator 4, 41 as in the previous example of FIG. 3, a detection scheme with a passively generated phase bias is employed in this example, as described in detail in reference [16]. In such an arrangement, the sensor 10 includes again a light source 1 which preferentially generates non-polarised light to enter an optical path with an optical fiber, an initial linear polarizer 55a (in 45° orientation with respect to the axes of the PM fiber 11) attached via a spacer 53 made of glass to an integrated-optic splitter 54. The light exits the integrated-optic splitter 54 via a PM fiber 11 with a cross-coupling element 16. The light returning from sensing fiber 12 is split and then passes a quarter-wave retarder and appropriately oriented polarizers 55b, 55c. The retarder 56 introduces a 90°-phase-bias between the returning light waves. The light is guided through two optical fibers to the respective detectors 5-1, 5-2, which can be photodiodes. The signals $S_{1,2}$ at the two detectors 5-1 and 5-2 are given by $$S_{1,2} \sim 1 \pm (-1)^M \cos \varepsilon \sin 4NVI \quad [5]$$

Dividing the difference of the two signals by their sum gives a signal that is independent of the light source power and is proportional to $$S \sim (-1)^M V(T, \lambda) N I \cos \varepsilon(T, \lambda) \quad [6]$$

Here, it is assumed that 4NVI<<1. The fiber quarter-wave retarder 14 at the near end of the sensing fiber 12 is again used to achieve a temperature independent current signal, i.e. the retarder deviates by an appropriate amount ε from perfect quarter-wave retardance, see also reference [16]. It should be noted that the retarder 56 and spacer 53 can also be interchanged such that the phase bias is introduced in front of the sensor head 10-1.

As in the previously described embodiments, another fiber retarder 16 is inserted as cross-coupling element 16 in the PM fiber lead 11 of the sensing coil 12 to achieve a wavelength-independent current signal. With the introduction of the additional retarder 16 the current signal is approximately proportional to (when again assuming that the sensing fiber is free of any non-magneto-optic birefringence)

$$S \sim (-1)^{M+m} V(\lambda) N \, I \cos \varepsilon(\lambda) \cos \beta(\lambda) \quad [7]$$

Analogously to the previous case, $\beta(\lambda_0)$ and N can be chosen such that the individual contributions to the overall wavelength dependence of the current signal compensate each other. The retardance of the quarter-wave retarder can be set to M=0 and $\varepsilon(\lambda_0)=-9.5°$ to balance the temperature dependence of the Verdet constant (assuming that the sensing fiber is free of linear birefringence). The relative wavelength dependence of the sensor signal amounts to $$\Delta S/S_0 = \Delta \lambda/\lambda_0 (-2 + [M \cdot 180° + \varepsilon(\lambda_0)] \tan \varepsilon(\lambda_0) + [m \cdot 180° + \beta(\lambda_0)] \tan \beta(\lambda_0))$$

In the given example, the half-wave retarder 16 can be set to N=2 and $\beta(\lambda_0)=21°$ to compensate the variations of the sensor signal with wavelength due to the combined contributions from the Verdet constant and the quarter-wave retarder: $\Delta S/S_0 = (-2-0.29)\Delta\lambda/\lambda_0 = -2.29 \, \Delta\lambda/\lambda_0$. Note that the absolute value of $\beta(\lambda_0)$ is the same as for the sensor designs with non-reciprocal phase modulation (FIG. 3A, FIG. 3B) but the sign is opposite. With the values above, the individual signal contributions are again as those shown in FIG. 4.

In embodiments, already $\beta(\lambda_0) \approx +20°$ or $\beta(\lambda_0) < +20°$ (i.e. $\beta(\lambda_0)$ being smaller than $+20°$) can effect a partial (yet useful) compensation of the wavelength dependence of the Verdet constant and of the quarter-wave retarder 14.

In another embodiment as illustrated in FIG. 6 the sensor coil 12 is terminated by a Faraday polarization rotator mirror 15' for phase biasing (see also references [17, 18] for further details). The Faraday rotator 15' biases the current induced magneto-optical phase shift by 90°, i.e. this rotator 15' corresponds to a single pass polarization rotation angle of 22.5° (or equivalently a single pass differential phase shift of 45° for left and right circular light waves).

Hence, light from the light source 1 is guided through an optical fiber into a combined polarizing splitter 24 and into the PM fiber 11 with an integrated cross-coupling element 16. On the return after being reflected and phase-shifted by the rotation mirror 15', the signals at the two detectors 5-1, 5-2 are equivalent to the signals in the previous configuration and are given by:

$$S_{1,2} \sim [1 \pm \sin(4NVI + 4\alpha)]. \quad [9]$$

The term $\alpha(T, \lambda)$ is the deviation of the single pass rotation angle of the Faraday rotator from 22.5°. Dividing the difference of the two signals by their sum again gives a signal that is independent of the light source power (with the assumption 4NVI<<1):

$$S \sim V(T, \lambda) N \, I \cos 4\alpha(T, \lambda) \quad [10]$$

The half- or quarter-wave retarder 14 in some sensor designs between the PM fiber 11 and the sensing fiber 12 (see also FIG. 1) is set to zero for the sake of simplicity (M=0 and $\varepsilon=0$). By including an extra retarder as cross-coupling element 16 in the PM fiber link 11 to achieve the disclosed controlled, wavelength-dependent polarization cross-coupling, the current signal is as well proportional to $\cos^2 \beta(\lambda)$. Proper adjustment of N and $\beta$ enables compensation of the wavelength dependence of the current signal, including a compensation of the wavelength dependence of the Faraday rotator 15' and the sensing fiber 12.

The compensation for wavelength dependency is not limited to the wavelength-dependent contributions from the Verdet constant of the sensing fiber 12 and contributions from the retarder 14. It can also compensate other contributions, such as those of the embedded linear birefringence in a spun, highly birefringent sensing fiber 12 or of the bend-induced linear birefringence in a sensing fiber 12 with low intrinsic birefringence. Hence, the value of $\beta$ has to be appropriately adapted, if the cross-coupling element 16 is also to compensate for those elements.

In the above variants it was assumed that the cross-coupling element 16 is kept at constant temperature by a temperature stabilization environment 160. Particularly, in the sensor according to FIG. 3A or FIG. 3B, the extra retarder 16 is preferably part of the optoelectronic module 10-2. At this location, a stable temperature of the cross-coupling element 16 can be achieved, for example by means of a thermoelectric cooler/heater (not shown).

In addition or alternatively, the temperature of the cross-coupling element 16 can be measured and the temperature-dependence of the cross-coupling element 16 can be corrected at a signal processing stage. Small or negligible temperature dependence of the element 16 can also be achieved through the use of a fiber with low temperature dependence of the differential phase shift such as polarization-maintaining fibers with birefringence determined by their geometrical structure, e.g. elliptical core or microstructured fibers. Such fibers are known to show a relatively weak temperature dependence in comparison to fibers with stress induced birefringence.

A compensation of the temperature-dependence of element 16 can also be achieved, if both the cross-coupling element 16 in the PM fiber link and the retarder 14 at the beginning of sensing fiber 12 are subject to the same ambient temperature. In such a case the additional temperature contribution stemming from the cross-coupling element 16 can be balanced by an extra contribution from the retarder element 14 to the overall temperature dependence of the signal. Taking again a configuration as in FIG. 3 as an example, the relative signal change due to a temperature change $\Delta T$ of the cross-coupling element 16 amounts to $\Delta S/S_0 = \tan \beta(T_0, \lambda_0) [N \cdot 180° + \beta(T_0, \lambda_0)] C_{HW} \Delta T$, wherein the constant $C_{HW}$ describes the relative change of the retardance with temperature. Both retarders 14, 16, i.e. m, M, $\varepsilon$, and $\beta$, can be adjusted so that the overall temperature dependence as well as the overall wavelength dependence vanishes. In more detail, the parameters have to be chosen so that not only $dS/d\lambda=0$ (or small) is fulfilled (as in the examples above), but also $dS/dT=0$ (or small), which in the example of FIG. 3A results in:

$$0 = -2 - \tan \varepsilon(T_0, \lambda_0)[M \cdot 180° + 90° + \varepsilon(T_0, \lambda_0)] - \tan \beta(T_0, \lambda_0)[m \cdot 180° + \beta(T_0, \lambda_0)] \quad [11]$$

and $$0 = C_{Verdet} + C_{QW} \tan \varepsilon(T_0, \lambda_0)[M \cdot 180° + 90° + \varepsilon(T_0, \lambda_0)] + C_{HW} \tan \beta(T_0, \lambda_0)[m \cdot 180° + \beta(T_0, \lambda_0)] \quad [12]$$

Figure 7:
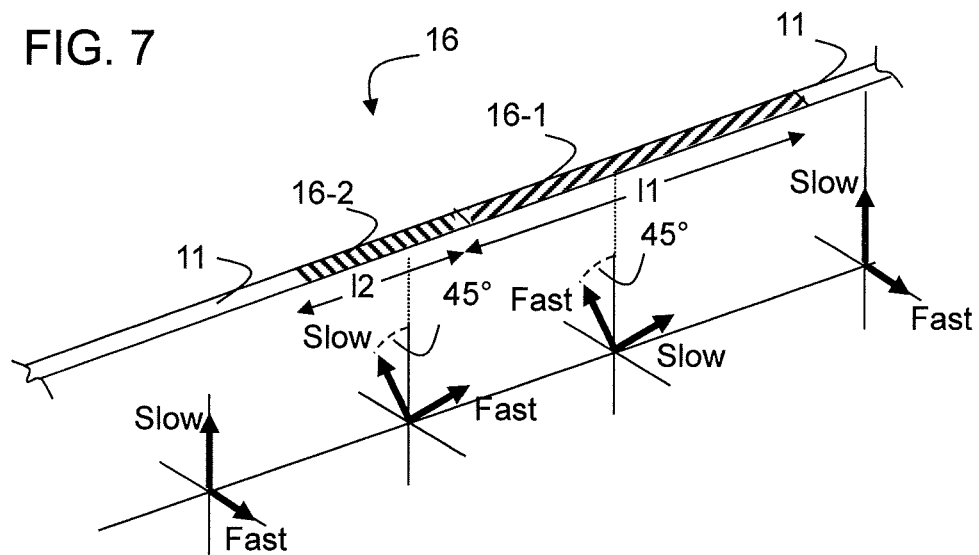
FIG. 7 shows an example of a temperature-insensitive cross-coupling element.

As a further alternative or in addition to other thermal stabilization methods as described above, it is possible to prepare the cross-coupling element 16 as an athermal retarder. This can be achieved as illustrated in FIG. 7. Here, the cross coupling element 16 consists of two sections of PM fiber: a fiber section 16-1 of length $l_1$ with small temperature dependence (e.g. an elliptical-core fiber) and a section of length $l_2$ with larger temperature dependence (e.g. a Panda fiber). The two fiber sections 16-1, 16-2 are joined with a 90°—offset in the orientation of their principal axes. As a result the birefringent phase changes due to temperature changes add with opposite sign and tend to cancel each other. Assuming for simplicity that the birefringence Δn (and beat length) of both fiber sections is the same but the temperature coefficients differ by a factor of 5, the combined phase retardance of the two fiber sections will be independent of temperature if the length ratio is chosen as: $l_1:l_2=5:1$. The length $l_1$ must be chosen as $l_1=(5/4)\lambda_0\varphi/(2\pi\Delta n)$ in order to achieve the desired total retardance of φ at reference center wavelength $\lambda_0$.

It should be noted that the above described methods and components for reducing the temperature dependence of the sensor 10 can be used separately or in isolation from each other or in combination with each other.

While only reflective sensor configurations are considered in the above examples, the invention also applies to Sagnac-type fiber optic current sensors, see for example reference [3] and other types of non-reflective fiber-optic current sensors that contain a PM fiber lead to transmit light from or to the sensing fiber. In a Sagnac-type current sensor according to reference [3], at least one appropriately adjusted cross-coupling element can be included into each of the PM fiber leads of the sensor. As a result of the application of the half-wave retarders, part of the light travels with a polarization orthogonal to the launched polarization direction in between the retarders. Thereby, the sensitivity of the sensor can be controlled in a wavelength dependent manner, since the cross-coupled light experiences a Faraday phase shift of opposite sign.

In the detailed embodiments disclosed in this document, a 45° degree angle between the axes of the PM fiber 11 and the axes of the retarder 16 is assumed. It is preferred that the tolerances of this angle (i.e. orientation angle ζ) remain within ±(45°±10°) or at least within ±(45°±22.5). However, it is to be understood that an angle different from 45° can also be chosen intentionally. In this case the retardance of cross-coupling element 16 must be adapted accordingly in order to achieve again full compensation of effects of source wavelength shifts on the sensor signal sensitivity.

In the examples shown, the cross-coupling retarder 16 is integrated between two parts of the PM fiber 11, which is in most cases the preferred location. However, it is also possible to place the cross-coupling retarder 16 between the phase modulator 4 and the PM fiber 11, between the 45°-splice 3 and the phase modulator 4, or between beam splitter 54 and the PM fiber 11 or even integrate it into the beam splitter 54. On the other hand, it is possible to position the cross-coupling element 16 just before the components of the sensor head, e.g. between distal end of the PM fiber 11 and any additional retarder such as retarder 14.

Depending on the sensor embodiment, the cross-coupling element is preferred to be in a common housing with the phase modulator 4 or the beam splitter 54.

Figure 8:
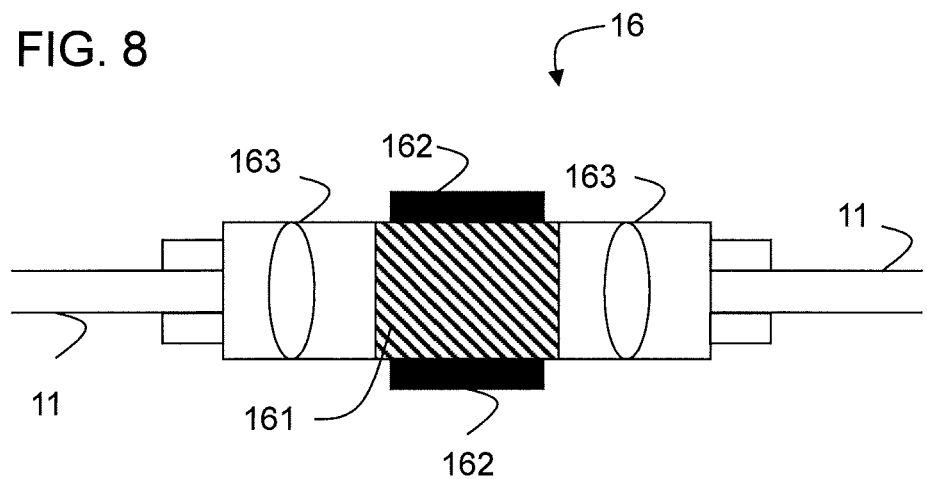
FIG. 8 shows a cross-coupling element based on a Faraday rotator.

In another embodiment as illustrated by FIG. 8, a Faraday rotator can be used as cross-coupling element 16. A Faraday rotator 16 comprises a magneto-optic crystal 161 and a permanent magnet 162 exerting a magnetic field on the crystal 161. A fiber-coupled Faraday rotator 16 typically comprises in addition lenses 163 to couple the light into and out of the PM fiber 11. The crystal 161 rotates incoming linear light polarization states by an angle defined by the type and length of the crystal 161 and by the magnetic field of the permanent magnet 162.

To achieve wavelength compensation, the Faraday rotator 16 can be set for example to a single-pass rotation angle of i*90°+γ at the wavelength $\lambda_0$, wherein i is any integer including zero and γ a bias rotation angle. Due to the wavelength dependence of the magneto-optic effect in the crystal, γ is wavelength dependent, e.g. $\gamma \sim \lambda^{-2}$. With γ≠0, this Faraday rotator 16 generates a wavelength dependent cross coupling between the two polarizations of the PM fiber as described previously. Accordingly, i and γ can be chosen to balance all wavelength dependent contributions to the sensor signal similar to the case of retarder described in detail before.

The invention can also be used with sensors that work with orthogonal linear polarizations in the sensing medium rather than circular polarizations and that employ detection schemes according to FIG. 3A, 3B and FIG. 5. Patent publication WO 2008/077255A1 (cited as reference [21]) discloses for example, how the detection schemes according to FIGS. 3A, 3B with active phase modulators can be adapted for sensing elements that work with orthogonal linear polarizations, see also Ref. [22, 23]. Even though not explicitly mentioned in Ref. [21], the adaptation is also valid for detection schemes with passive phase biasing, such as described above with reference to FIG. 5.

Figure 9A:
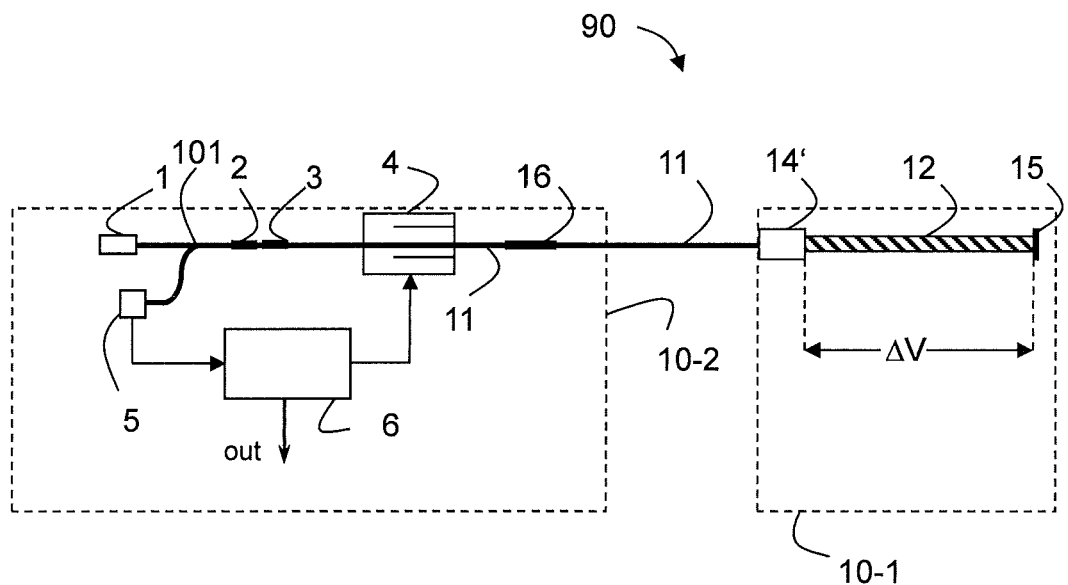
FIGS. 9A and 9B illustrate a fiber-optic voltage sensor in accordance with two examples of the invention having an active phase modulation detection scheme and a detection scheme with passive (static) phase bias, respectively.

As mentioned above when referring to FIG. 1, aspects of the invention include the use of a cross-coupling element 16 in an optical voltage or electric field sensor 90. A first example of such a sensor is shown in FIG. 9A. The general arrangement and rpeviously known components are described in further detail for example in reference [21]. As in FIG. 3A, the detection system includes a light source 1, a fiber coupler 101, a polarizer 2, a polarizer 3, an active phase modulator 4, a detector 5 and a signal processor 6. Two light waves with orthogonal polarization directions are again injected in a PM fiber 11 and sent towards the sensing element 12. For voltage measurements, the sensing element 12 of FIG. 9A includes a rod shaped electro-optic crystal 12, such as e.g. a $Bi_3Ge_4O_{12}$ (BGO) crystal to measure a voltage applied over the length of the crystal 12. Instead of a bulk electro-optic crystal a crystalline electro-optic fiber (e.g. also of $Bi_3Ge_4O_{12}$) [24] or an electrically poled fiber, as described for example in reference [25], can be used, as well.

A Faraday polarization rotator 14' rotates the two orthogonal light waves emerging from PM fiber 11 by 45° before they enter the electro-optic crystal 12. The polarization directions after the Faraday rotator 14' coincide with the electro-optic axes of the crystal 12. The light is reflected at the far end of the crystal 12 by the reflector 15. The two orthogonal light waves experience a differential electro-optic phase shift in the crystal 12 that is proportional to the applied voltage. The Faraday rotator 14' rotates the returning light waves by another 45° so that the total roundtrip polarization rotation corresponds to 90° like in the current sensor of FIG. 3A. (The polarization rotation is needed so that the roundtrip group delay of the orthogonal polarization states in PM fiber 11 is zero and the two waves are again coherent when they interfere at the polarizer. Moreover, the modulation concept assumes swapped polarization states on the return path.)

The cross-coupling element 16 in the PM fiber is added again to compensate for wavelengths shifts of the light source. Assuming the cross-coupling element 16 is a detuned half-wave retarder, and the detuning angle or detuning phase shift $\beta(\lambda_o)$ is now adjusted so that the cross-coupling element 16 balances the wavelength dependence of the electro-optic effect. Other than the Faraday effect (Verdet constant) the electro-optic effect varies in proportion to the inverse of the wavelength (rather than the inverse of the square of the wavelength). As a result the proper value of $\beta(\lambda_o)$ in case of the electro-optic effect is only half the value of β(λ$_o$) in case of the Faraday effect. Moreover, β(λ$_o$) can be chosen such that it compensates for the wavelength dependence of Faraday rotator 14' (and possibly further components) in addition to compensation for the wavelength dependence of the electro-optic effect.

Figure 9B:
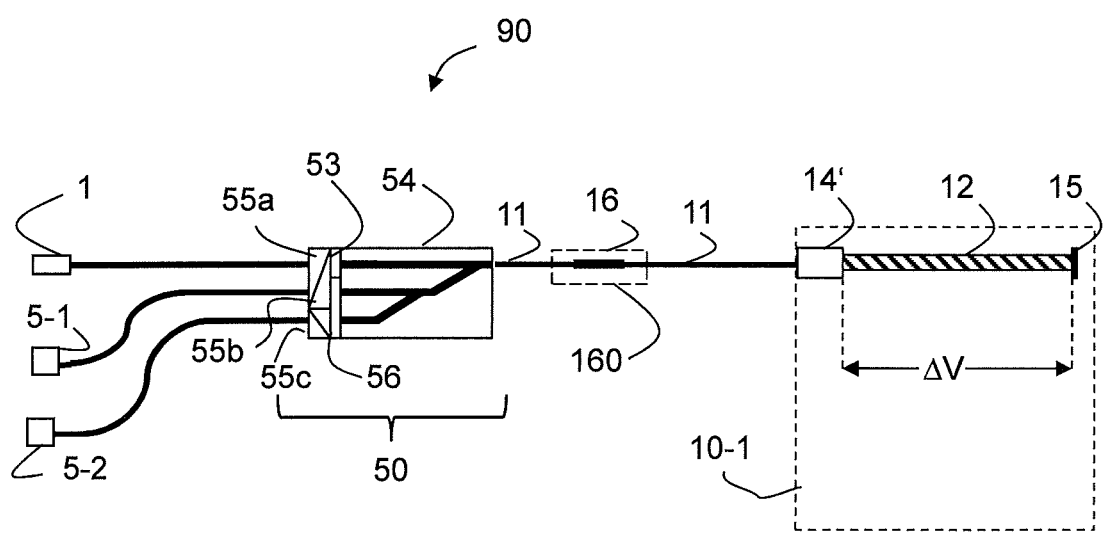

A second example of a voltage sensor 90 is shown in FIG. 9B. The sensing element 12 includes a rod shaped electro-optic Bi$_3$Ge$_4$O$_{12}$ (BGO) crystal 12 to measure a voltage applied over the length of the crystal 12. Instead of a bulk electro-optic crystal 12 an electro-optic fiber 12 may be used such as a crystalline fiber [24] or an electrically poled fiber, as described for example in reference [25].

A Faraday polarization rotator 14' rotates the two orthogonal light waves emerging from PM fiber 11 by 45° before they enter the electro-optic crystal 12. The polarization directions after the Faraday rotator 14' coincide with the electro-optic axes of the crystal 12. The light is reflected at the far end of the crystal 12 by means of reflector 15. The two orthogonal light waves experience a differential electro-optic phase shift in the crystal 12 that is proportional to the applied voltage. The Faraday rotator 14' rotates the returning light waves by another 45° so that the total roundtrip polarization rotation corresponds to 90°.

In the example of FIG. 9B a detection scheme with a passively generated phase bias is employed, as described in detail in reference [16] and with reference to FIG. 5 above. In such an arrangement, the sensor 90 includes again a light source 1 which preferentially generates non-polarized light to enter an optical path with an optical fiber, an initial linear polarizer 55a (in 45° orientation with respect to the axes of the PM fiber 11) attached via a spacer 53 made of glass to an integrated-optic splitter 54. The light exits the integrated-optic splitter 54 via a PM fiber 11 with an optional cross-coupling element 16. The light returning from the sensor head 10-1 is split and then passes a quarter-wave retarder 56 and appropriately oriented polarizers 55b, 55c. The retarder 56 introduces a 90°-phase-bias between the returning light waves. The light is guided through two optical fibers to the respective detectors 5-1, 5-2, which can be photodiodes. It should be noted that the retarder 56 and spacer 53 can also be interchanged, i.e. with the spacer element in front of the polarizers 55b and 55c such that the phase bias is introduced prior to entering the sensor head 10-1. In the example of FIG. 9B the initial linear polarizer 55a (in 45° orientation with respect to the axes of the PM fiber 11) the spacer 53, the 1×3 integrated-optic splitter 54, the quarter-wave retarder 56 and the polarizers 55b, 55c are shown as an single integrated passive optical module, herein referred to as integrated optical polarization splitter module 50.

It should be further noted that the compensation provided by the cross-coupling element 16 is optional for operation of the sensor of FIG. 9B. Hence in a variant of the example of FIG. 9B the cross-coupling element 16 and its temperature stabilizing environment 160 can be omitted, in particular when the light source is itself temperature stabilized.

There is a variety of options how to install a voltage sensor of this kind in high voltage power transmission systems. In air-insulated substations the sensing element may be mounted in an insulator with gas [26] or dry insulation [27]. The insulator may be installed as a free-standing insulator or hanging from a power line. In gas-insulated switchgear it may be installed in ways as disclosed in [28] and [29]. Furthermore, the sensing element may be part of a capacitive voltage divider and measure only a fraction of the line voltage [30]. It should be noted that instead of the integrated-optic splitter (54) with waveguides as shown in in FIGS. 5, 9B, a splitter of the same functionality can be made using bulk components, e.g. using beam splitter cubes and/or prisms.

The method of the present invention can be applied for compensation of wavelength shift also in other sensor configurations, for example those disclosed in Ref. [21]. In particular, the sensing element 12 may represent an optical voltage sensor based on the piezo-electric effect in materials such as quartz. The quartz element(s) strain(s) a PM sensing fiber in the presence of an applied voltage and as a result introduce(s) again a voltage-dependent phase shift between the orthogonal polarization states of the sensing fiber (see ref. [21] for further details). The PM sensing fiber may also in a similar manner act as a sensor for strains or forces of other origin.

Note that the Faraday rotator 14' of FIGS. 9 has a function different from the Faraday rotator of FIG. 8, which acts as a cross-coupling element 16 and different from the Faraday rotator 15' of FIG. 6, which acts as a phase biasing element.

The light source may already emit light with a sufficiently high degree of linear polarization due to inherent polarization means or an integrated polarizer. In this case, at least parts of the functionality of the polarizers 2, 41, 55a, 24 as shown in FIGS. 3A, 3B, 5, and 9 can be incorporated into the light source. This requires all fiber components between source 1 and sensor element 12 to be polarization-maintaining.

In the following, the further aspect of the invention is discussed in detail. For the fiber-optic current sensor configurations similar to FIGS. 3A, 3B but not including the shown cross-coupling element 16, the current signal is in good approximation proportional to the expression given in equation [1], with the two temperature dependent contributions from V(T,λ) and ε(T,λ). The linear temperature dependence results in a relative change ΔS/S$_0$ of the sensor signal (with S$_0$ being a central or undisturbed signal) given by equation [13]:

$$\Delta S/S_0 = \Delta T \cdot (C_{Verdet} + C_{QW} \cdot [M \cdot 180° + 90° + \varepsilon(T_0, \lambda_0)] \cdot \tan[\varepsilon(T_0, \lambda_0)]) \quad [13]$$

wherein ΔT=temperature change of the cross-coupling element 16, C$_{verdet}$=temperature dependence of the Verdet constant, C$_{QW}$=temperature coefficient of the retarder, M=0, 1, 2, 3, . . . , ε=detuning from quarter-wave retardance, T$_0$=reference temperature, and λ$_0$=reference wavelength. With the example parameters selected herein to be M =0, C$_{Verdet}$=0.7×10$^{-4}$° C.$^{-1}$ and C$_{QW}$=−2.4×10$^{-4}$° C.$^{-1}$, the linear term of the temperature dependence substantially vanishes by setting ε(T$_0$,λ$_0$)=9.5°.

However, a parabolic, i.e. quadratic, term remains which can be found from the equation [13] by Taylor series expansion as follows:

$$\Delta S/S_0 = 0.5 \cdot \Delta T^2 \cdot (\tan^2[\varepsilon(T_0, \lambda_0)] + \sec^2[\varepsilon(T_0, \lambda_0)]) \cdot (C_{QW} \cdot [M \cdot 180° + 90° + \varepsilon(T_0, \lambda_0)])^2 \quad [14]$$

Figure 10:
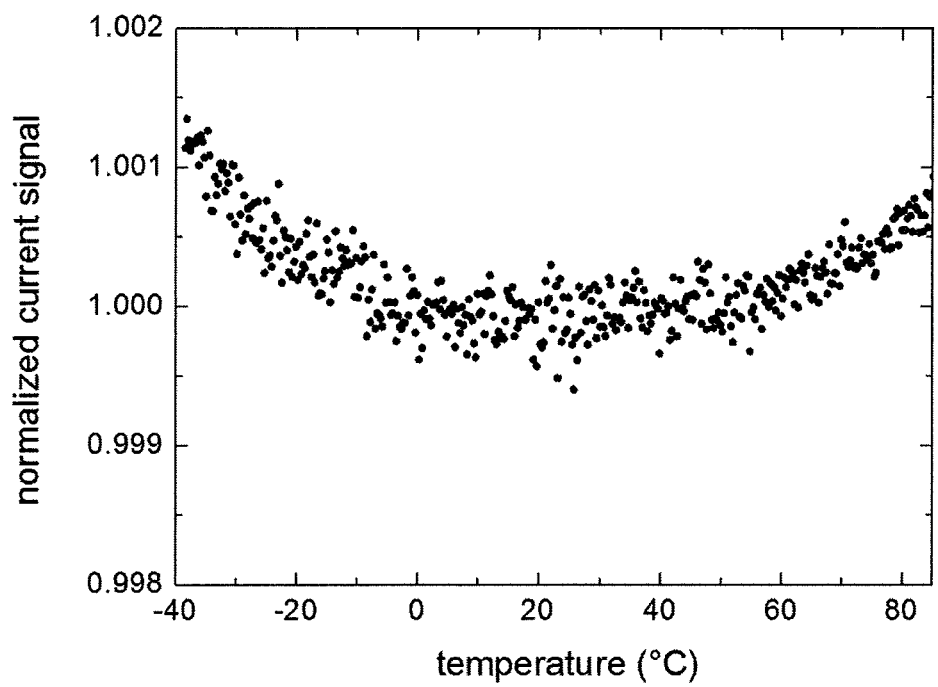
FIG. 10 shows a typical normalized sensor signal versus temperature of a state-of-the-art fiber-optic current sensor.

With the numerical example parameters from above, the quadratic contribution to ΔS/S$_0$ amounts approximately to 9·10$^{-8}$° C.$^{-2}$, i.e. to 0.033% at 60° C. above or below the reference temperature T$_0$. In real sensor systems the quadratic signal contribution may exceed this value as shown in FIG. 10, where it reaches about 0.1% at the extreme temperatures.

This quadratic temperature dependence can be compensated for according to the further aspect of the invention. A cross-coupling element 16 providing a defined temperature dependent cross-coupling is inserted into the optical circuit of a fiber-optical sensor, such as fiber-optical current sensor 10 as shown in FIGS. 1, 3A, 3B, 5, and 6 or a fiber-optical-voltage sensor 90 as shown in FIGS. 9A and 9B. The cross-coupling element is e.g. placed between the polarizing element 2, 41, 55a, 24a and the sensing element 12 so that the cross-coupling is separated from the sensing element 12 by at least a retarder 14, a Faraday rotator 14', or a section of polarization maintaining fiber 11. The disclosed invention can be applied to different embodiments of fiber-optic sensors, of which some are described in more detail herein with respect to their design and working principle. As the cross-coupling element 16 is preferably exposed to a temperature as similar as possible to the temperature of the sensing element 12, a configuration with element 16 being spatially close to the sensing element 12, e.g. by sharing a common housing with the sensing element 12, is preferred. In other less favourable embodiments the element 16 can be a part of the optoelectronic module 10-2, as indicated in FIG. 3A.

Temperature-dependent contributions to the signal can—depending on the sensor design—originate from the temperature dependence of the magneto-optic effect in the sensing element 12 (given by the temperature dependence of the Verdet constant), of the electro-optic effect of the sensing element 12, e.g. given by the temperature dependence of the Pockels effect, of the piezo-electric effect of a piezo-electrical material attached to the sensing element, of the intrinsic birefringence in the sensing element 12 such as in a spun highly-birefringent optical fiber, of bend-induced birefringence in the sensing fiber 12, of the working point of the sensor, e.g. in a sensor configuration where the working point is adjusted by a Faraday rotator mirror 15' (FIG. 6), of a fiber retarder at the entrance to the sensing fiber 14, of a Faraday rotator 14' at the entrance of the sensing element 12 (FIGS. 9a and 9b), of mechanical stress exerted on the sensing fiber, or of combinations thereof.

Figure 11:
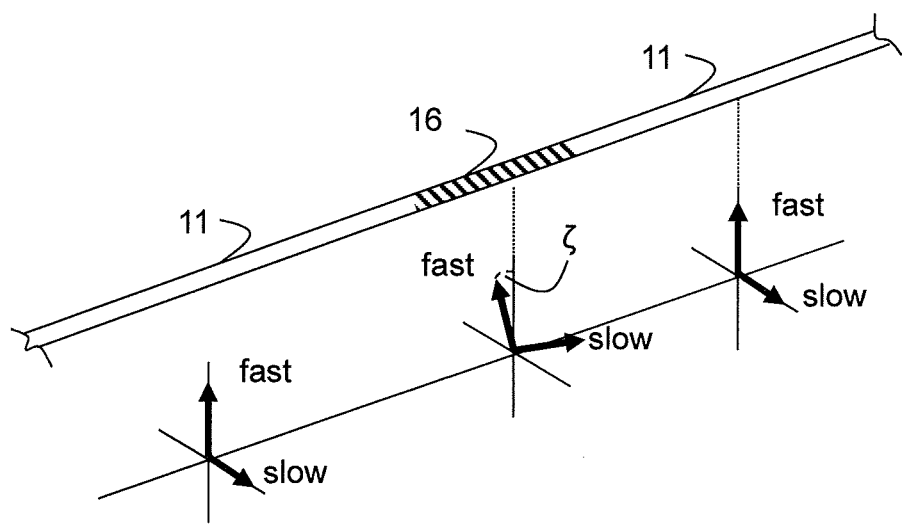
FIG. 11 shows a fiber retarder as an embodiment of the cross-coupling element.

For further description, the embodiment of a fiber-optical current sensor 10 using an optical phase modulator 4 between the polarizing element 2 and the cross coupling element 16 as in FIG. 3A is considered in more detail. Nevertheless, the invention can be equally applied to different embodiments of fiber-optic sensors, in particular to embodiments with an optical splitter 54 between the polarizing element 55 and the cross coupling element 16, with the following mathematical expressions and quantitative values being subject to proper modification. Furthermore, it is assumed that the linear temperature variation due to the Verdet constant in the sensing fiber 12 is counteracted by the temperature dependence introduced by the fiber retarder 14 (see equation [13]), i.e. in the numerical example above $\varepsilon(T_0, \lambda_0)$ is set to 9.5°. In this case, the quadratic contribution to be compensated by the temperature dependent cross-coupling of element 16 amounts to $9 \times 10^{-8}$ °C.$^{-2}$. In this embodiment, the cross-coupling element 16 is represented by an optical retarder 16, preferably a fiber-based retarder 16 built from a short section of polarization maintaining fiber, with its principal axes aligned under an orientation angle of $\zeta$ with respect to the incoming light polarization. For example, the retarder 16 can be inserted into the polarization maintaining fiber section 11 as depicted in FIG. 11. Preferably, all polarization maintaining fiber sections 11 have a length so that the relative phase delay exceeds the coherence length of the light source utilized. With the retardation of the cross-coupling element 16 denoted by 5, the signal can be approximately calculated to be $$S \sim V(T,\lambda) \cdot NI/(\cos[\varepsilon(T,\lambda)] \cdot \{\cos^2[2\zeta] + \cos[\delta(T,\lambda)] \cdot \sin^2 2\zeta\}) \quad [15]$$

Note that by setting $\zeta = \pm 45°$, this expression coincides with the expression given in equation [3].

Accordingly, by setting the retardance $\delta(T_0, \lambda_0)$ (i.e. half wave retardance or generally half retardance of the cross-coupling element 16) to an integer multiple of 180°, the cross coupling element 16 does not introduce a linear temperature dependence. Under the assumption of a vanishing second order temperature dependence of the Verdet constant, the overall second-order temperature dependence then becomes:

$$\Delta S/S_0 = 0.5 \cdot \Delta T^2 \cdot \{(\tan^2[\varepsilon(T_0,\lambda_0)] + \sec^2[\varepsilon(T_0,\lambda_0)]) \cdot (C_{QW} \cdot [M \cdot 180° + 90° + \varepsilon(T_0,\lambda_0)])^2 + (C_{HW} \delta(T_0,\lambda_0))^2 \cdot \cos[\delta(T_0,\lambda_0)] \cdot \sin^2[2\zeta]/(\cos^2[2\zeta] + \cos[\delta(T_0,\lambda_0)] \cdot \sin^2[2\zeta])\}$$

Figure 12:
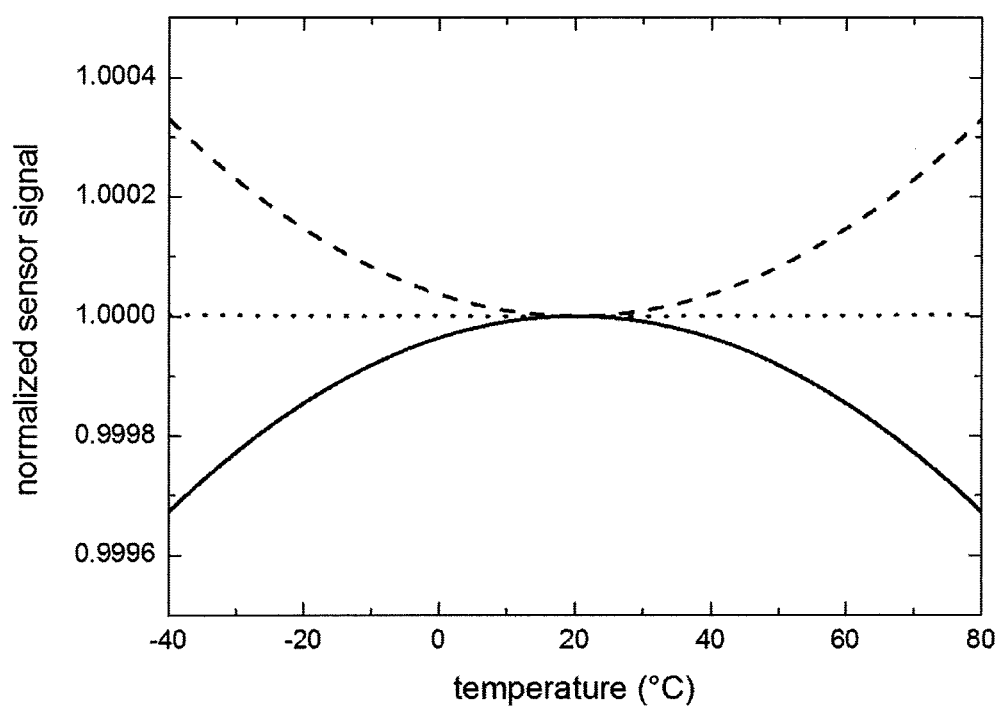
FIG. 12 shows a calculated normalized sensor signal of a fiber-optic current sensor versus the temperature of the cross-coupling element (solid curve) and versus the common temperature of the sensing element and a fiber retarder at the entrance to the sensing fiber (dashed curve) as well as the combined temperature dependence (dotted curve).

Accordingly, by setting the retardance $\delta(T_0, \lambda_0)$ of the cross-coupling element 16 to an odd multiple of 180°, the quadratic temperature-dependent contribution from the cross-coupling element 16 to the sensor signal counteracts the quadratic temperature-dependent contribution from the retarder 14 to the sensor signal. Proper choice of orientation angle(s) $\zeta$—depending on the temperature variation of retardance $\delta(T_0, \lambda_0) = m \cdot 180°$ (with m being an odd integer) given by $C_{HW} \cdot \delta(T_0, \lambda_0)$—results in a vanishing quadratic temperature variation, i.e. together with the temperature compensation by the detuned quarter-wave retarder 14, the sensor signal becomes independent of temperature up to third order variations in temperature. Overall, the parabolic=quadratic coefficient introduced by the cross-coupling element 16 can be tuned by choice of the orientation angle $\zeta$, the order of the retarder m, and the quantity $C_{HW}$. The quantity $C_{HW}$ is given by the temperature dependence of the birefringence of the optical fiber used for the fiber retarder 16 and can accordingly be tuned by the choice of the proper type of linear birefringent optical fiber. Typical choices include elliptical core fiber, panda or bow-tie fiber, elliptical cladding fiber, and microstructured birefringent fiber. With the numerical parameters from above and assuming $C_{HW} = C_{QW}$, setting m=3 and orientation angles $\zeta = 5.25°$ removes the second order temperature dependence of the sensor. This is illustrated in FIG. 12, where the calculated residual quadratic temperature dependence of retarder 14 and sensing element 12 indicated by the dashed curve is counteracted by the calculated temperature dependence of the cross-coupling element 16 indicated by the solid curve such that the combined temperature dependence of the normalized current signal becomes independent of temperature (dotted curve).

As seen from expression [16], other choices of retardance $\delta(T_0, \lambda_0)$ and orientation angle $\zeta$ of the cross-coupling element 16 yield a different temperature dependence of the cross-coupling element 16 that in the general case can also be optimized to compensate a (residual) linear temperature dependence, e.g. of further components of the fiber-optical sensor. In particular, in fiber-optic voltage sensors 90, an overall temperature dependence resulting from the temperature dependence of the electro-optical effect in the sensing element 12 and of the Faraday rotator 14' can be compensated for.

In further embodiments of the invention, a first cross-coupling element can be used to compensate the overall wavelength dependence of the sensor and a second cross-coupling element can be used to compensate a residual temperature dependence of the sensor, in particular a quadratic temperature dependence. In such a configuration (not shown), the second cross-coupling element resides close to the sensing element 12, in particular in a common housing with the sensing element 12, in order to be exposed to the same or a similar temperature as the sensing element 12;

whereas the first-cross coupling preferably shares a common housing with the opto-electronic module 10-2 or with at least parts of the opto-electronic module 10-2. In configurations where parts of the opto-electronic module 10-2 and the sensing element 12 share a common housing, also first and second cross-coupling element can share a common housing.

Throughout this application, tan x=sin x/cos x, and sec x=1/cos x, with x being any variable which may also be written in parentheses [x]; and multiplication can be denoted by dot · or simply by empty space between variables.

While there are shown and described presently preferred embodiments of the invention, it is to be understood that the invention is not limited thereto but may be otherwise variously embodied and practised within the scope of the following claims. In particular, embodiments or features relating to the sensor are also disclosed for the method and vice versa.

REFERENCES CITED

[1] DE 4224190A1.

[2] G. Frosio and R. Dandliker, "Reciprocal reflection interferometer for a fiber-optic Faraday effect current sensor," Applied Optics, vol. 33, pp. 6111-6116, 1994.

[3] K. Bohnert, et al., "Temperature and vibration insensitive fiber-optic current sensor," Journal of Lightwave Technology, vol. 20, pp. 267-276, 2002.

[4] WO 2011/069558.

[5] EP 1 115 000 A2 (U.S. Pat. No. 6,734,657B2).

[6] EP 2 306 212 A1.

[7] EP 1 107 029 A2.

[8] A. H. Rose, et al., "Verdet constant dispersion in annealed optical fiber current sensors," Journal of Lightwave Technology, vol. 15, pp. 803-807, 1997.

[9] J. L. Cruz, et al., "Faraday effect in standard optical fibers: dispersion of the effective Verdet constant," Applied Optics, vol. 35, pp. 922-927, 1996.

[10] U.S. Pat. No. 5,365,338.

[11] US 2007/0097374 A1.

[12] U.S. Pat. No. 5,684,590.

[13] U.S. Pat. No. 7,515,271.

[14] U.S. Pat. No. 7,227,644.

[15] R. C. Jones, "A new calculus for the treatment of optical systems," J.O.S.A, vol. 31, pp. 488-493, 1941.

[16] WO 2007/121592A1.

[17] H. Lin, et al., "Modified in-line Sagnac interferometer with passive demodulation technique for environmental immunity of a fiber-optic current sensor," Applied Optics, vol. 38, pp. 2760-2766, 1999.

[18] F. BRIFFOD, et al., "Polarimetric current sensor using an in-line Faraday rotator," IEICE TRANSACTIONS ON ELECTRONICS E SERIES C, vol. 83, pp. 331-335, 2000.

[19] EP 1 154 278 A2.

[20] K. Bohnert, et al., "Fiber-optic current sensor for electrowinning of metals," Journal of Lightwave Technology, vol. 25, pp. 3602-3609, 2007.

[21] WO 2008/077255A1

[22] S. Wildermuth, K. Bohnert, and H. Brandle, "Interrogation of a birefringent fiber sensor by non-reciprocal phase modulation", IEEE Photonics Technology Letters vol. 22, pp. 1388-1390, 2010.

[23] X. Feng, L. Li, X. Wang, C. Zhang, J. Yu, and C. Li, "Birefringence elimination of bismuth germanate crystal in quasi-reciprocal reflective optical voltage sensor", Applied Optics, vol. 52, pp. 1676-1681, 2013.

[24] US 2009/0290165 A1.

[25] US 2011/0050207 A1.

[26] K. Bohnert, P. Gabus, H. Brandle, and A. Khan, "Fiber-optic current and voltage sensors for high-voltage substations", in 16$^{th}$ Int. Conference on Optical Fiber Sensors, Nara, Japan, Oct. 13-17, 2003, Technical Digest, pp 752-755.

[27] WO 2011/154029A1

[28] U.S. Pat. No. 6,016,053

[29] WO 2009/080109A1

[30] T. Mitsui, K. Hosoe, H. Usami, and S. Miyamoto, "Development of fiber-optic voltage sensors and magnetic field sensors", IEEE Trans. Power Delivery, 2, 87-93 (1987).

[31] X. Wang, S. Chen, Z. Du, X. Wang, C. Shi, and J. Chen, "Experimental Study of Some Key Issues on Fiber-Optic Interferometric Sensors Detecting Weak Magnetic Field", IEEE Sensors Journal 8, 1173-1179, 2008.

[32] K. Bohnert, M. Ingold, and J. Kostovic, "Fiber-Optic Voltage Sensor for $SF_6$ Gas-Insulated High-Voltage Switchgear", Appl. Opt. 38, 1926-1932, 1999.

LIST OF REFERENCE SIGNS light source 1
fiber coupler 101
optical fiber polarizer 2
polarizing splitter 24
45° fiber splice 3
optical phase modulator 4
y-type optical phase modulator, polarizer 41
90° fiber splice 42
polarization maintaining fiber coupler 43
optical delay element 44
detector 5, 5-1, 5-2
integrated optical polarization splitter module 50
spacer 53
splitter 54
polarizer 55*a*
polarizer 55*b*
polarizer 55*c*
quarter-wave retarder 56
signal processor 6
fiber-optical current sensor 10
sensor head 10-1
opto-electronic module 10-2
polarization maintaining fiber 11
sensing element (fiber, crystal) 12
conductor 13
optical retarder 14
Faraday polarization rotator 14'
reflector 15
Faraday polarization rotator mirror 15'
cross-coupling element(retarder, Faraday rotator) 16
fiber sections 16-1, 16-2
temperature stabilized environment 160
magneto-optic material 161
magnet 162
lens(es) 163
optical voltage sensor 90

The invention claimed is:

1. A fiber optic sensor comprising:
   a light source;
   a polarizing element;
   a detector;
   a polarization maintaining (PM) fiber;
   a sensing element; and
   a cross-coupling element in an optical path between the polarizing element and the sensing element,
   wherein the cross-coupling element is configured to generate a defined cross-coupling between the two orthogonal polarizations of the fundamental mode in the PM fiber,
   wherein the cross-coupling element and the sensing element are separated along the optical path, and
   wherein a quadratically temperature-dependent contribution from the cross-coupling element to a sensor signal of the fiber optic sensor is configured to counteract a quadratically temperature-dependent contribution from at least one other element of the fiber optic sensor to the sensor signal.

2. The fiber optic sensor of claim 1, wherein the at least one other elements element comprises a retarder.

3. The fiber optic sensor of claim 1, wherein the cross-coupling element and the sensing element are separated by at least one element selected from the group consisting of: at least a section of PM fiber, a retarder, and a Faraday rotator.

4. The fiber optic sensor of claim 1, wherein the cross-coupling element is a separate element from the PM fiber.

5. The fiber optic sensor of claim 4, wherein the PM fiber is a non-ideal PM fiber having residual cross-coupling between orthogonal polarizations.

6. The fiber optic sensor of claim 1, wherein the sensing element is sensitive to an external field selected from an electrical field, a magnetic field or a strain field.

7. The fiber optic sensor of claim 1, wherein the cross-coupling element comprises an optical retarder or a Faraday rotator.

8. The fiber optic sensor of claim 1, wherein the cross-coupling element comprises a retarder detuned from exact half-wave retardance or exact multiple-order half-wave retardance by a non-zero amount or phase $\beta(\lambda_o)$.

9. The fiber optic sensor of claim 1, wherein the cross-coupling element is a fiber retarder comprising a birefringent fiber, an elliptical core fiber or a microstructured birefringent fiber.

10. The fiber optic sensor of claim 1, wherein the principal optical axes of the PM fiber and the principal optical axes of the cross-coupling element are rotated against each other by an orientation angle $\zeta$ in the range of $\pm(45°\pm22.5°)$.

11. The fiber optic sensor of claim 1, wherein the principal optical axes of the PM fiber and the principal optical axes of the cross-coupling element are rotated against each other by an orientation angle $\zeta$ in the range of $\pm(45°\pm10°)$.

12. The fiber optic sensor of claim 1, wherein the cross-coupling element is a half wave retarder with principal axes forming an orientation angle $\zeta$ in the range of $\pm15°$ or in a range of $90°\pm15°$ with respect to the principal axes of the PM fiber, and with a half wave retardance $\delta(T_0,\lambda_0)$ equal to an integer multiple of $180°$ within $\pm20°$ to achieve a sensor signal insensitive to temperature up to second order within a given temperature range.

13. The fiber optic sensor of claim 1, comprising a retarder configured to compensate for linearly temperature-dependent shifts in the sensor signal caused by temperature changes of at least one of the cross-coupling element, the sensing element, or another optical element.

14. The fiber optic sensor of claim 13, wherein the retarder is further configured to compensate for the linearly temperature-dependent shifts by introducing a quadratically temperature-dependent shift in the sensor signal.

15. The fiber optic sensor of claim 1, wherein the sensing element comprises a sensing fiber configured to be looped around a conductor and to be exposed to a magnetic field of a current in the conductor during operation.

16. The fiber optic sensor of claim 1, wherein the sensing element comprises an electro-optical crystal, an electro-optic fiber, or a fiber connected to piezo-electric material.

17. The fiber optic sensor of claim 1, wherein the sensing element is terminated with a reflective element.

18. The fiber optic sensor of claim 1, further comprising an optical phase modulator in the optical path between the polarizing element and the sensing element.

19. The fiber optic sensor of claim 1, further comprising an optical beam splitter in the optical path between the polarizing element and the sensing element.

20. A high-voltage power transmission network comprising the fiber optic sensor of claim 1.

* * * * *